US008730415B2

(12) United States Patent
Omote et al.

(10) Patent No.: US 8,730,415 B2
(45) Date of Patent: May 20, 2014

(54) COVER GLASS INTEGRATED SENSOR

(75) Inventors: Ryomei Omote, Kyoto (JP); Takao Hashimoto, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 0 days.

(21) Appl. No.: 13/820,044

(22) PCT Filed: Dec. 19, 2011

(86) PCT No.: PCT/JP2011/079382
§ 371 (c)(1),
(2), (4) Date: Feb. 28, 2013

(87) PCT Pub. No.: WO2012/086596
PCT Pub. Date: Jun. 28, 2012

(65) Prior Publication Data
US 2013/0153393 A1    Jun. 20, 2013

(30) Foreign Application Priority Data

Dec. 21, 2010 (JP) ................................ 2010-285194
Dec. 21, 2010 (JP) ................................ 2010-285195

(51) Int. Cl.
*G02F 1/1335* (2006.01)
*G06F 3/041* (2006.01)

(52) U.S. Cl.
USPC ............................................ 349/12; 345/173

(58) Field of Classification Search
CPC ............................... G06F 3/044; G06F 3/0412
USPC ............................................ 349/12; 345/173
See application file for complete search history.

(56) References Cited

U.S. PATENT DOCUMENTS

2010/0164881 A1* 7/2010 Kuo et al. ...................... 345/173
2012/0073947 A1* 3/2012 Sakata et al. .................. 200/600

FOREIGN PATENT DOCUMENTS

| JP | 2009-070191 A | 4/2009 |
| JP | 2009-276821 A | 11/2009 |
| JP | 2010-515969 A | 5/2010 |
| WO | 2009/035471 A1 | 3/2009 |
| WO | WO 2011030773 A1 * | 3/2011 |

OTHER PUBLICATIONS

International Search Report of corresponding International Application No. PCT/JP2011/079382, dated on Mar. 19, 2012.
Written Opinion of the International Searching Authority of corresponding International Application No. PCT/JP2011/079382, dated on Mar. 8, 2012.
Notice to Submit a Response of the corresponding Korean patent application No. 10-2013-7005045, dated Jun. 21, 2013.

* cited by examiner

*Primary Examiner* — Dennis Y Kim
(74) *Attorney, Agent, or Firm* — Global IP Counselors, LLP

(57) ABSTRACT

A cover glass integrated sensor has an excellent visibility of sharp outlines of the display screen as seen through the cover glass and has a sense of unity in appearance in portions surrounding the display screen. The cover glass integrated sensor includes a cover glass and a capacitance type film sensor. The cover glass includes a glass substrate and a first frame-like light-blocking layer made of a screen printing film formed on peripheral portion on the rear surface of the glass substrate. The capacitance type film sensor has a second frame-like light-blocking layer made of an exposure/development product of color resist material formed on a periphery of the front surface. The capacitance type film sensor is attached to a rear surface of the cover glass. An inner edge of the second frame-like light-blocking layer is closer to the center than an inner edge of the first frame-like light-blocking layer.

20 Claims, 30 Drawing Sheets

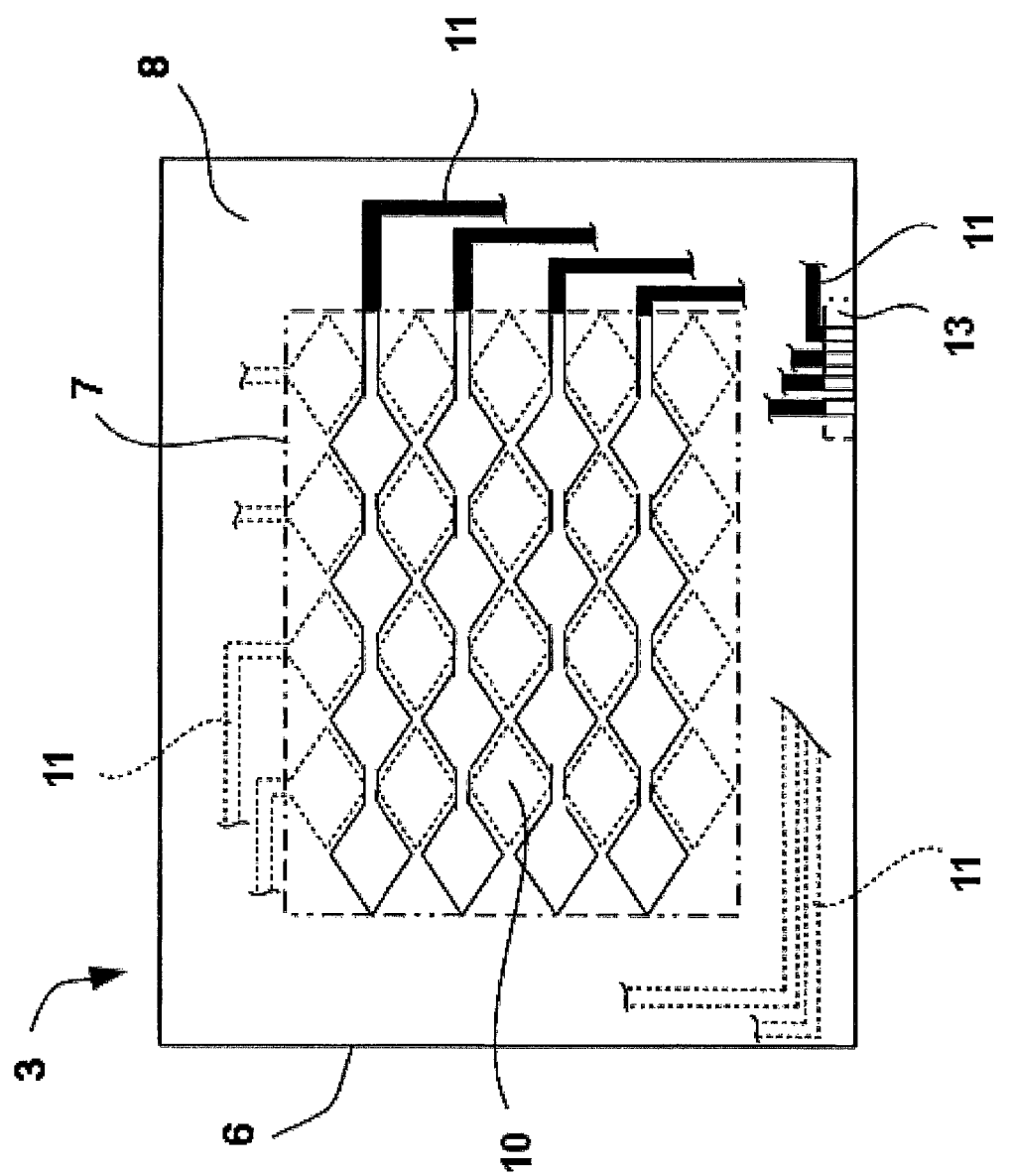

COVER GLASS INTEGRATED SENSOR

TECHNICAL FIELD

The present invention relates to a cover glass integrated sensor in which a capacitance type film sensor is adhered to the rear surface of the cover glass to be attached to an LCD display portion of electronic devices.

BACKGROUND ART

Typically, a cover glass is attached to the LCD display window of the electronic devices (for example, portable information terminals such as PDAs and handy terminals, office automation equipment such as copying machines and facsimile apparatuses, smartphones, portable phones, portable game devices, electronic dictionaries, car navigation systems, small PCs, digital cameras, video cameras, portable MDs (PMD)), so as to protect the LCD display window of the devices. Conventionally, the cover glass includes a black frame-like light-blocking layer formed on the peripheral portions of the backside of the transparent glass substrate.

Further, in the above-described electronic devices, many of them employ a touch panel. Recently, as a trend, there is a growing need for capacitance type touch panel, because it has a multi-touch function of enlarging and reducing the images by flapping, snapping, and pinching images with finger tips, and has excellent visibility and durability, as compared to the currently mainstream resistive type. Especially, since the sensor unit employing the capacitance type touch panel has been required to be thinner, it is assumed that the market will be increased for a cover glass integrated sensor 101 (Refer to FIG. 6), as disclosed in Unexamined Patent Publication No. 2009-70191, having a capacitance type film sensor 103 adhered to a rear surface of a cover glass 102.

SUMMARY

However, since a frame-like light-blocking layer 105 of the cover glass 102 is formed on peripheral portions of the rear surface of the transparent glass substrate 104 by screen printing with a light-blocking ink, such as black color, the frame-like light-blocking layer 105, which is formed by the above-described method, has a very poor linearity along the inner edge. Accordingly, the outline of the display screen seen through the cover glass 102 looks blurred (Refer to FIG. 7).

Further, the frame-like light-blocking layer of the cover glass formed by the screen printing requires overprinting three layers of the printing films in order to obtain a light-blocking effect, thereby causing a big level difference between the peripheral portions and the central portion on the backside of the glass substrate. This level difference causes a problem that air bubbles are likely to be generated when the film sensor is attached to the rear surface of the cover glass with transparent adhesive. In addition, it is difficult to remove the generated air bubbles by pushing them to slide them toward outside. As a result, the visibility of the display screen becomes deteriorated.

In order to solve this problem, it was thought that, in the display device, the inner edge of the black mask surrounding the display screen would be positioned nearer to the center than the inner edge of the frame-like light-blocking layer of the cover glass. However, according to the structure of the display device, the black mask is positioned behind a polarization plate and an upper glass substrate, so that there is a big difference in depth between the revealed portions of the black mask and the frame-like light-blocking layer of the cover glass, thereby causing another problem that the portions surrounding the display screen lack a sense of unity in appearance.

Therefore, it is an object of the present invention to solve the above-mentioned problems, and especially to provide a cover glass integrated sensor having an excellent visibility of having a sharp outline of the display screen seen through the cover glass, and having a sense of unity in appearance at portions surrounding the display screen.

TECHNICAL SOLUTION

According to a first aspect of the present invention, a cover glass integrated sensor is provided for a display window for electronic devices. The cover glass integrated sensor comprises a cover glass and a capacitance type film sensor adhered to a rear surface of the glass cover. The cover glass includes a transparent glass substrate and a first frame-like light-blocking layer made of a screen printing film. The first frame-like light-blocking layer is formed on a peripheral portion of a backside of the glass substrate.

The film sensor includes a transparent base sheet, transparent conductive films, light-blocking conductive films, and anticorrosion functional layers. The transparent conductive films are formed on both a front surface and a rear surface of the base sheet, and each includes an electrode pattern formed in a central window of the base sheet and a fine line routed circuit pattern formed in a peripheral frame of the base sheet. The light-blocking conductive films are formed on the fine line routed circuit patterns of the transparent conductive films, with the same width as that of the fine line routed circuit pattern. The anticorrosion functional layers are laminated on both the front surface and the rear surface of the base sheet, the base sheet having the transparent conductive films and the light-blocking conductive films formed thereon, so as to cover the peripheral frame except terminals.

The film sensor further includes a second frame-like light-blocking layer. The second frame-like light-blocking layer is made of an exposed and developed product of a color resist material, and is formed on a peripheral portion on the front surface of the base sheet. An inner edge of the second frame-like light-blocking layer is closer to the center than an inner edge of the first frame-like light-blocking layer.

According to the first aspect of the present invention, the second frame-like light-blocking layer can be an additional separate layer different from the transparent conductive films, the light-blocking conductive films, and the anticorrosion functional layers. The second frame-like light-blocking layer can also serve as the anticorrosion functional layer. In other words, in the former case, a second frame-like light-blocking layer made of an exposure/development product of the color resist material is formed on the peripheral portion on the front surface of the base sheet, the base sheet having the transparent conductive films, the light-blocking conductive films, and the anticorrosion functional layers formed thereon. In the latter case, the anticorrosion functional layer is made of an exposure/development product of the color resist material and functions as the second frame-like light-blocking layer.

According to the second aspect of the present invention, the cover glass integrated sensor according to the first aspect is provided, wherein a distance between the backside of the glass substrate and the second frame-like light-blocking layer is 10 μm to 100 μm.

According to the third aspect of the present invention, the cover glass integrated sensor according to the first aspect or the second aspect is provided, wherein a color of the first frame-like light-blocking layer near the inner edge and a color of the second frame-like light-blocking layer are the same or similar.

According to the fourth aspect of the present invention, the cover glass integrated sensor according to the third aspect is provided, wherein the color difference ΔE between the color of the first frame-like light-blocking layer near the inner edge and the color of the second frame-like light-blocking layer in L*a*b* color coordinate system of CIE (International Commission on Illumination) 1976 (JIS Z8729) is 10 or less.

According to the fifth aspect of the present invention, the cover glass integrated sensor according to any of the first to fourth aspects is provided, wherein the color of the second frame-like light-blocking layer is black or white.

According to the sixth aspect of the present invention, the cover glass integrated sensor according to any of first to fifth aspects is provided, wherein the thickness of the first frame-like light-blocking layer is 7 μm to 30 μm, and the thickness of the second frame-like light-blocking layer is 2 μm to 25 μm.

According to the seventh aspect of the present invention, a cover glass integrated sensor according to any of the first to sixth aspects is provided, wherein a difference between a dimension between the inner edges of the second frame-like light-blocking layer and a dimension between the inner edges of the first frame-like light-blocking layer is 0.1 mm to 0.3 mm.

According to a cover glass integrated sensor of the present invention, the film sensor includes the transparent base sheet, the transparent conductive films, the light-blocking conductive films, and the anticorrosion functional layers. The transparent conductive films are formed on both surfaces of the base sheet so as to form an electrode pattern on the central window and a fine line routed circuit pattern on the peripheral frame. The light-blocking conductive films are formed on the fine line routed circuit pattern of the transparent conductive films so as to have the same width as that of the fine line routed circuit pattern. The anticorrosion functional layers are laminated on both surfaces of the base sheet, with the base sheet having the transparent conductive films and the light-blocking conductive films formed thereon, so as to cover the peripheral frame except the terminals. Further, the film sensor includes the second frame-like light-blocking layer made of an exposure/development product of the color resist material on the front surface of the peripheral portion of the base sheet. And the inner edge of the second frame-like light-blocking layer is closer to the center than the inner edge of the frame-like light-blocking layer (first frame-like light-blocking layer) of the cover glass. Accordingly, the second frame-like light-blocking layer made of an exposure/development product of the color resist material has an excellent linearity along the inner edge, so that the outline of the display screen as seen through the cover glass looks sharp.

Further, since the film sensor includes the second frame-like light-blocking layer, a light-blocking effect can be obtained with the laminated structure, which includes the second frame-like light-blocking layer and the first frame-like light-blocking layer of the cover glass that is formed by screen printing. In other words, the first frame-like light-blocking layer can be thinner than the conventional ones, and a level difference between the peripheral portions and the central portion on the backside of the glass substrate can be smaller. Accordingly, when the film sensor is adhered to the rear surface of the cover glass with transparent adhesive, air bubbles are unlikely to be generated, and, even if they are generated, it would be easier to push the air bubbles to slide them toward outside for removal. As a result, visibility of the display screen is improved.

Further, since the film sensor includes the second frame-like light-blocking layer, there is little difference in depth between the revealed portion of the second frame-like light-blocking layer and the first frame-like light-blocking layer of the cover glass, thereby obtaining a sense of unity in the appearance in portions surrounding the display screen.

BRIEF DESCRIPTION OF THE DRAWINGS

FIG. 3 (b) is a sectional view showing steps of manufacturing a film sensor shown in FIG. 1;

FIG. 3 (c) is a sectional view showing steps of manufacturing a film sensor shown in FIG. 1;

FIG. 3 (d) is a sectional view showing steps of manufacturing a film sensor shown in FIG. 1;

FIG. 3 (e) is a sectional view showing steps of manufacturing a film sensor shown in FIG. 1;

FIG. 3 (f) is a sectional view showing steps of manufacturing a film sensor shown in FIG. 1;

FIG. 3 (g) is a sectional view showing steps of manufacturing a film sensor shown in FIG. 1;

FIG. 3 (h) is a sectional view showing steps of manufacturing a film sensor shown in FIG. 1;

FIG. 3 (i) is a sectional view showing steps of manufacturing a film sensor shown in FIG. 1;

FIG. 3 (j) is a sectional view showing steps of manufacturing a film sensor shown in FIG. 1;

FIG. 3 (k) is a sectional view showing steps of manufacturing a film sensor shown in FIG. 1;

FIG. 3 (l) is a sectional view showing steps of manufacturing a film sensor shown in FIG. 1;

FIG. 3 (m) is a sectional view showing steps of manufacturing a film sensor shown in FIG. 1;

FIG. 4 is a view of illustrating an electrode pattern and a fine line routed circuit pattern of the capacitance type film sensor;

FIG. 9 (b) is a sectional view showing steps of manufacturing a film sensor shown in FIG. 8;

FIG. 9 (c) is a sectional view showing steps of manufacturing a film sensor shown in FIG. 8;

FIG. 9 (d) is a sectional view showing steps of manufacturing a film sensor shown in FIG. 8;

FIG. 9 (e) is a sectional view showing steps of manufacturing a film sensor shown in FIG. 8;

FIG. 9 (*f*) is a sectional view showing steps of manufacturing a film sensor shown in FIG. 8;

FIG. 9 (*g*) is a sectional view showing steps of manufacturing a film sensor shown in FIG. 8;

FIG. 9 (*h*) is a sectional view showing steps of manufacturing a film sensor shown in FIG. 8;

FIG. 9 (*i*) is a sectional view showing steps of manufacturing a film sensor shown in FIG. 8; and FIG. 9 (*j*) is a sectional view showing steps of manufacturing a film sensor shown in FIG. 8.

DETAILED DESCRIPTION OF EMBODIMENTS

Hereinafter, the preferable embodiments according to the present invention will be explained with reference the drawings.

First Embodiment

Figure 1:
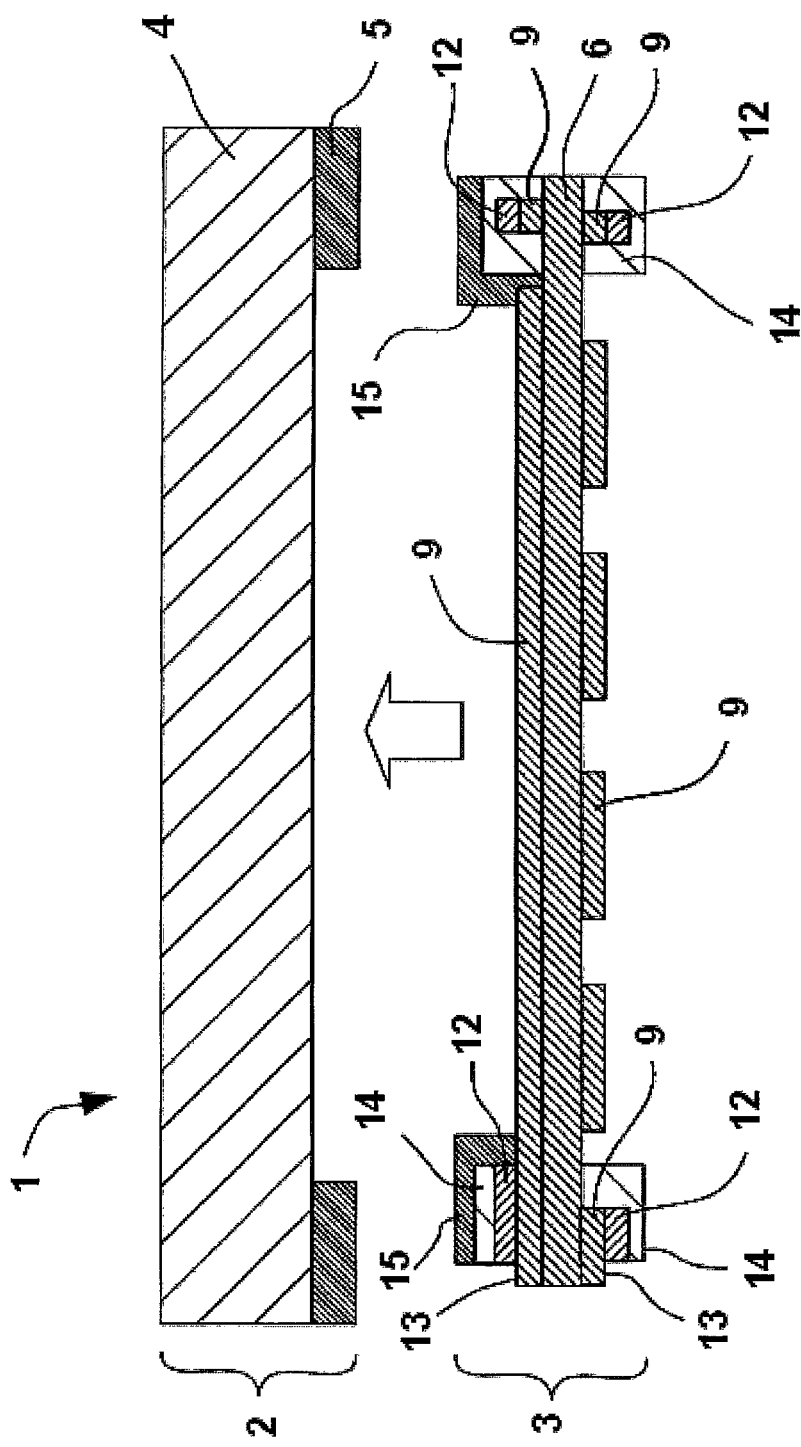
FIG. 1 is an exploded sectional view showing one embodiment of a cover glass integrated sensor according to the present invention.
Figure 2:
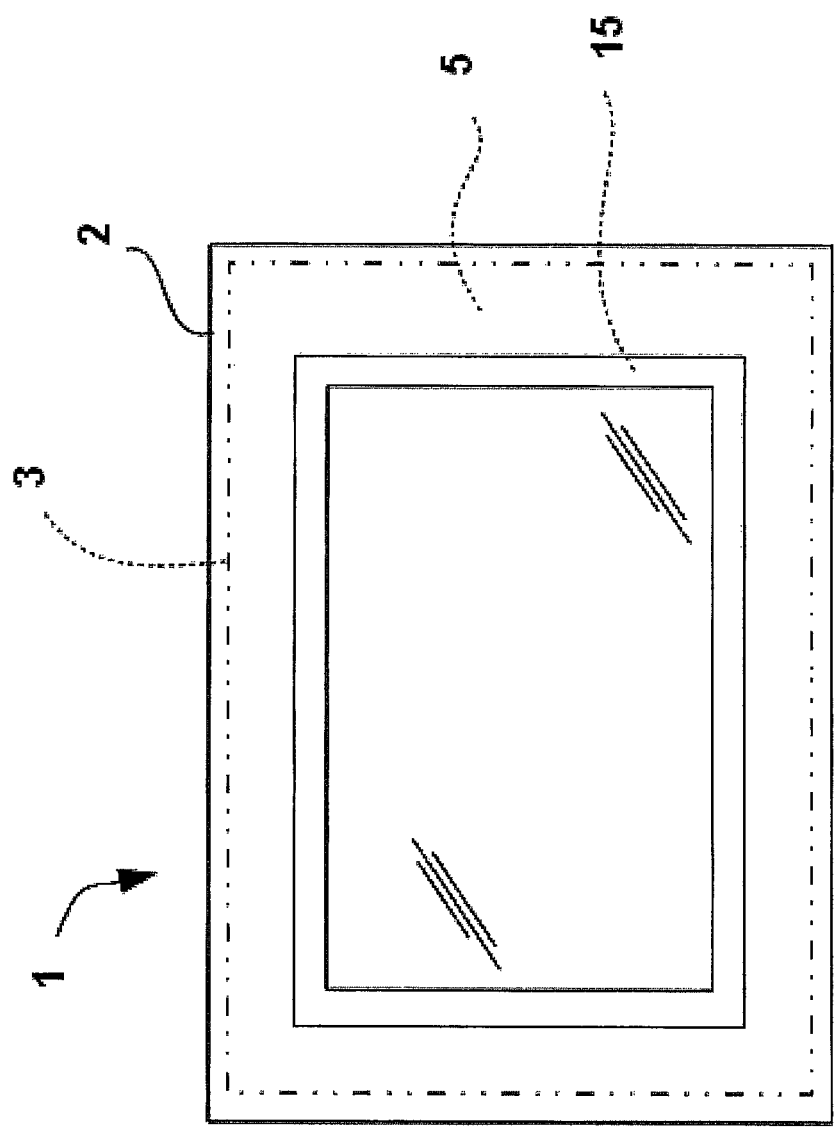
FIG. 2 is a plan view showing one embodiment of the cover glass integrated sensor of the present invention.

Hereinafter, referring to the drawings, the first embodiment according to the present invention will be described in detail. FIG. 1 is an exploded sectional view illustrating one example of the cover glass integrated sensor according to the present invention. FIG. 2 is a plan view illustrating one example of the cover glass integrated sensor according to the present invention. In the figures, reference numeral 1 denotes a cover glass integrated sensor, reference numeral 2 denotes a cover glass, reference numeral 3 denotes a film sensor, reference numeral 4 denotes a glass substrate, reference numeral 5 denotes a first frame-like light-blocking layer, reference numeral 6 denotes a base sheet, reference numeral 7 denotes a central window, reference numeral 8 denotes peripheral frames, and reference numeral 9 denotes transparent conductive films, reference numeral 10 denotes an electrode pattern, reference numeral 11 denotes a fine line routed circuit pattern, reference numeral 12 denotes a light-blocking conductive film, reference numeral 13 denotes terminals, reference numeral 14 denotes anticorrosion functional layers, and reference numeral 15 denotes a second frame-like light-blocking layer.

The cover glass integrated sensor 1 according to the present invention includes, as shown in FIG. 1, the cover glass 2 and the capacitance type film sensor 3. The cover glass 2 is used for an LCD display window of the electronic devices. In the cover glass 2, the first frame-like light-blocking layer 5, made of screen printing films, is formed on the peripheral portion of the rear surface of the transparent glass substrate 4. The capacitance type film sensor 3 is attached to the rear surface of the cover glass 2.

The cover glass 2 of the LCD display window of the electronic devices is placed on the display device of the electronic devices (not shown) in order to protect the display device.

The glass substrate 4 of the cover glass 2 may be made of transparent glass plates such as colorless transparent soda lime silicate glass, alminosilicate glass, lithium aluminosilicate glass, silica glass, alkali-free glass, or other glasses. The plate thickness of the glass substrate 4 is preferably between 0.3 to 0.7 mm, more preferably between 0.4 and 0.55 mm. If the plate thickness of the glass substrate 4 is within this range, the balance between the strength, plate thickness, and weight is excellent in the cover glass 2 according to the present invention. In addition, the glass substrate 4 is not required to be flat, i.e., a glass substrate with a curved surface can be used. Further, an antireflective film can be installed for preventing inadvertent appearance within the glass surface due to the reflection. Further, a hard coat film can be provided for improving abrasion resistance.

The first frame-like light-blocking layer 5 of the cover glass 2 may include, as a binder, resins such as polyvinyl resin, polyamide resin, polyester resin, polyacrylic resin, polyurethane resin, polyvinyl acetal resin, polyester-urethane resin, or alkyd resin, and a coloring ink containing an appropriate color pigment or dye as a colorant.

The film sensor 3 according to the present invention includes the transparent base sheet 6, the transparent conductive films 9, the light-blocking conductive films 12, the anticorrosion functional layers 14, and the second frame-like light-blocking layer 15. On both sides of the base sheet 6, the transparent conductive films 9 are formed so as to have the electrode pattern 10 on the central window 7 and the fine line routed circuit pattern 11 on the peripheral frame 8. The light-blocking conductive films 12 are laminated on the fine line routed circuit pattern 11 of the transparent conductive film 9, with the same width as that of the fine line routed circuit pattern 11. The anticorrosion functional layers 14 are laminated on both sides of the base sheet 6 on which the transparent conductive films 9 and the light-blocking conductive films 12 have been formed, so as to cover the peripheral frame 8 except the terminals 13. The second frame-like light-blocking layer 15 is constituted by an exposure/development product of the color resist materials, formed on periphery of the front surface of the base sheet 6 on which the transparent conductive films 9, the light-blocking conductive films 12 and the anticorrosion functional layers 14 have been formed. The inner edge of the second frame-like light-blocking layer 15 is located nearer the center than the inner edge of the first frame-like light-blocking layer 5.

Figure 5:
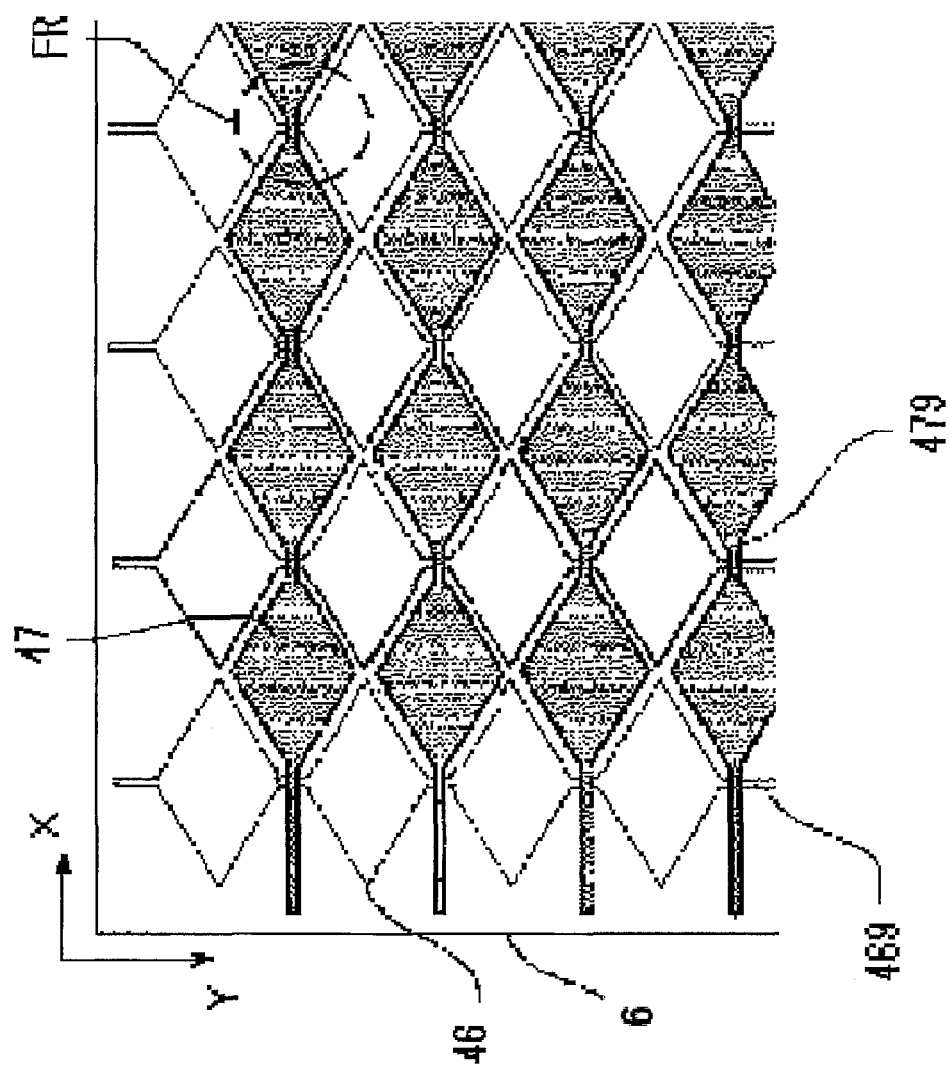
FIG. 5 is a plan view of illustrating one example of a shape and location state of the electrode pattern formed in the central window of the film sensor.
Figure 6:
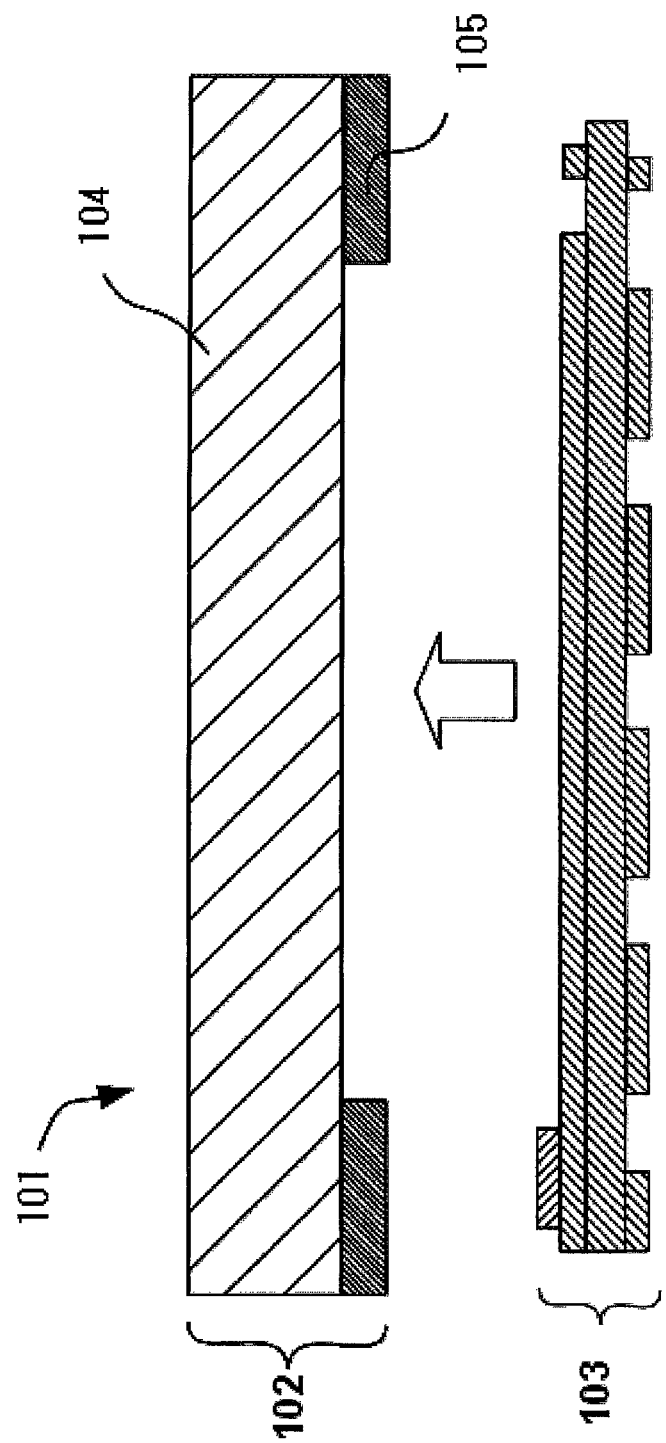
FIG. 6 is an exploded sectional view illustrating one example of the cover glass integrated sensor as a conventional technology.
Figure 7:
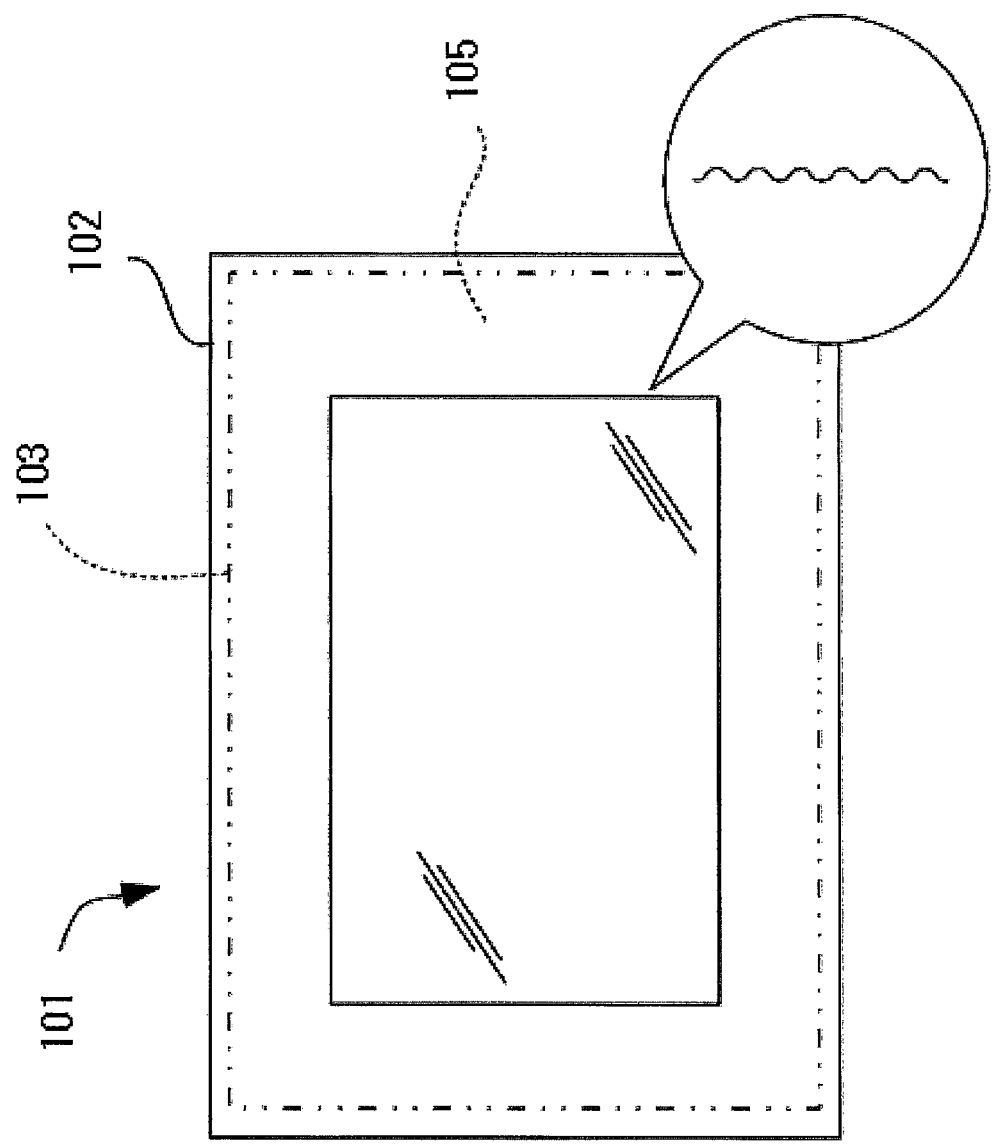
FIG. 7 is a plan view of illustrating one example of the cover glass integrated sensors as a conventional technology.

The electrode pattern 10 formed on the central window 7 of the film sensor 3 will be additionally explained. The patterns of the electrode pattern 10 are different on both sides. For example, as shown in FIG. 5, on the rear surface of the base sheet 6, there are rhombic electrodes 46 having a rhombic shape in a planar view, and interconnecting wiring 469 penetrating the plural rhombic electrodes 46 in a longitudinal direction (Y direction) in the figure. The plural rhombic electrodes 46 and the interconnecting wiring 469 are electrically connected with each other. The interconnecting wiring 469 and the plural rhombic electrodes are defined as one set, and the one set is repeatedly arranged in a lateral direction (X direction) in the figure. On the other hand, similar to the above, on the front surface of the base sheet 6, there are plural rhombic electrodes 47 and interconnecting wiring 479 penetrating the plural rhombic electrodes 47. It should be noticed that, in this case, the extending direction of the interconnecting wiring 479 is different from that of the interconnecting wiring 469, i.e., is the lateral direction (X direction) in the figure. According to this structure, the interconnecting wiring 479 and the plural rhombic electrodes 47 are defined as one set, which is repeatedly arranged in the longitudinal direction (Y direction) in the figure. Then, as shown in FIG. 5, the rhombic electrodes 46 are arranged so as to fill the gaps between the plurality of the interconnecting wirings 479, and the rhombic electrodes 47 are arranged so as to fill the gaps between the plurality of the interconnecting wirings 469. As shown in FIG. 5, the location relationship between the rhombic electrodes 46 and the rhombic electrodes 47 is a complementary relationship. In other words, the plural rhombic electrodes 47 are arranged so as to fill the rhombic gaps defined when the rhombic electrodes 46 are arranged in a matrix state.

Because the X direction electrodes and Y-direction electrodes are arranged so as to form a lattice in a planar view, if a finger or the like of a user touches any position on the lattice (for example, a position indicated by a broken circular mark FR) through the cover glass, a capacitor is formed between the finger or the like and the X-direction electrode in contact, and between the finger or the like and the Y-direction electrode in contact. The formation of the capacitors increases the capacitance of X-direction electrode and Y-direction electrode in contact. A position detection unit of the external circuit detects a variation of the capacitance generated in this case, and further detects the combination of the X-direction electrode and Y-direction electrode having the maximum capacitance, so that a set of X coordinate value and Y coordinate value can be obtained as specific values indicating the position that is touched in the central window 7.

The method of manufacturing the film sensor 3 having the above-described structure will be explained in detail.

<Patterning of the Transparent Conductive Film 9>

Figure 3:
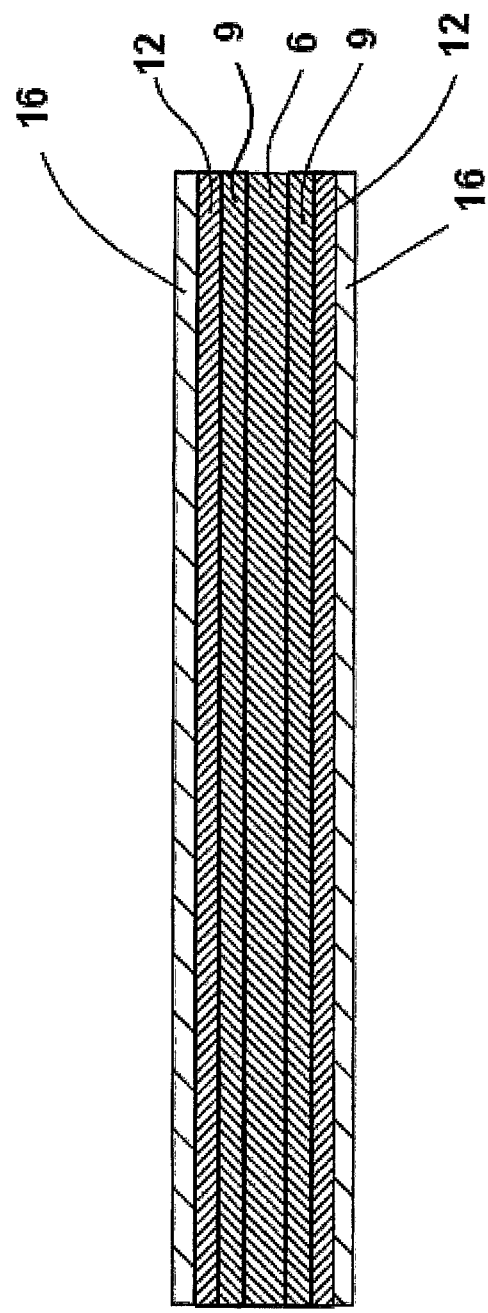
FIG. 3 (a) is a sectional view showing steps of manufacturing a film sensor shown in FIG. 1.
Figure 3B:
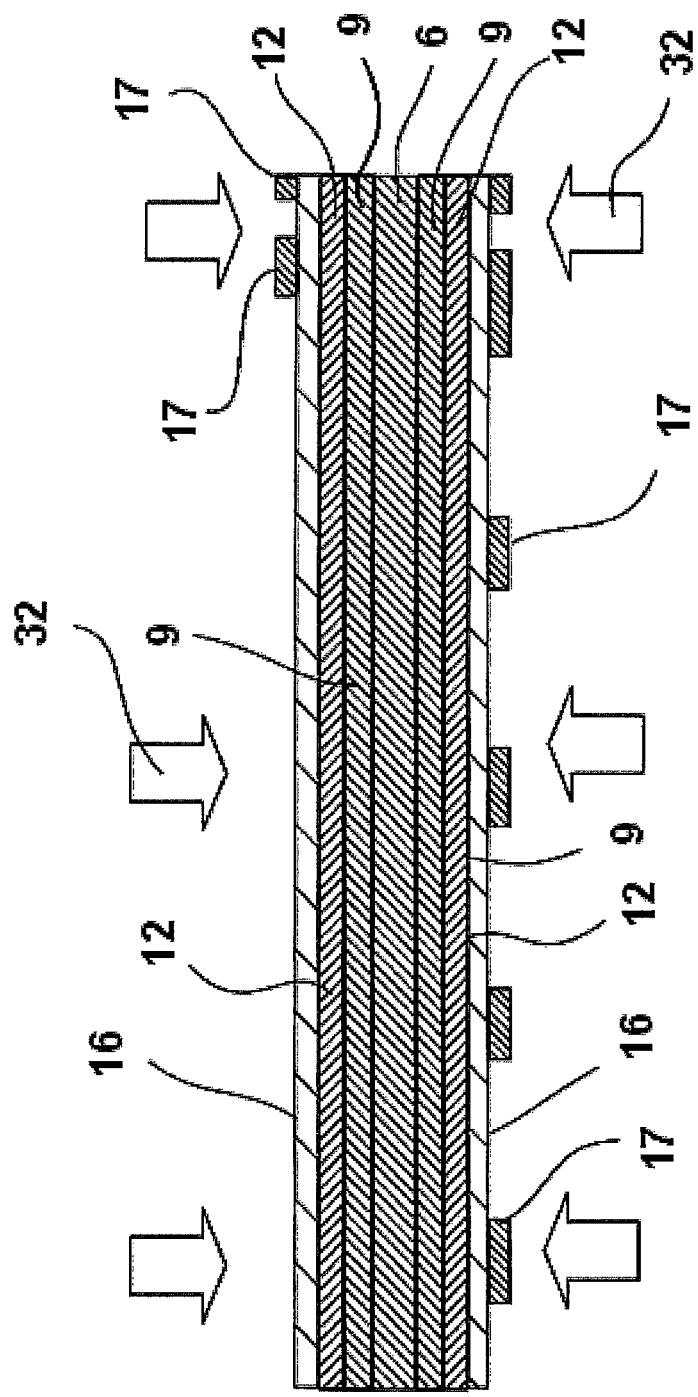
Figure 3C:
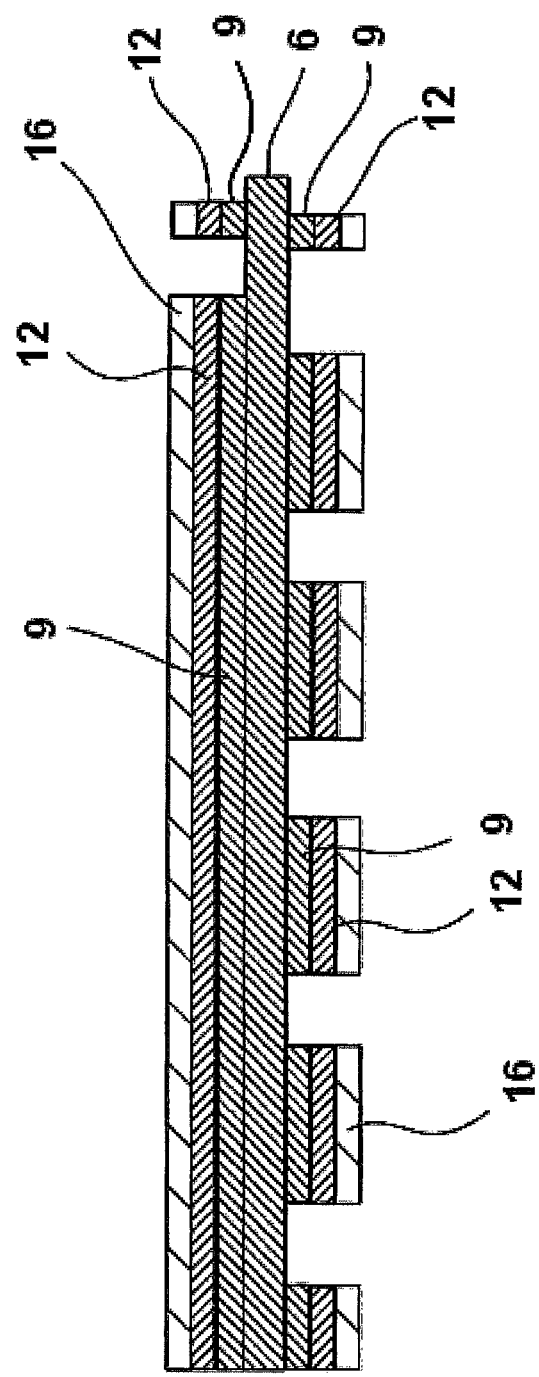
Figure 3D:
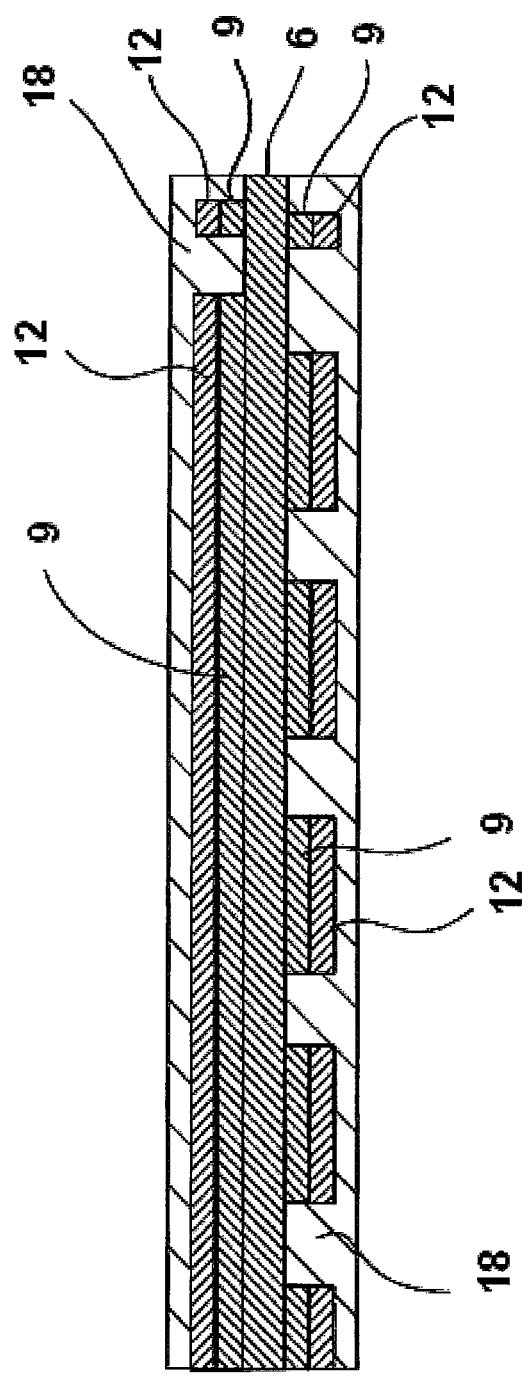
Figure 3E:
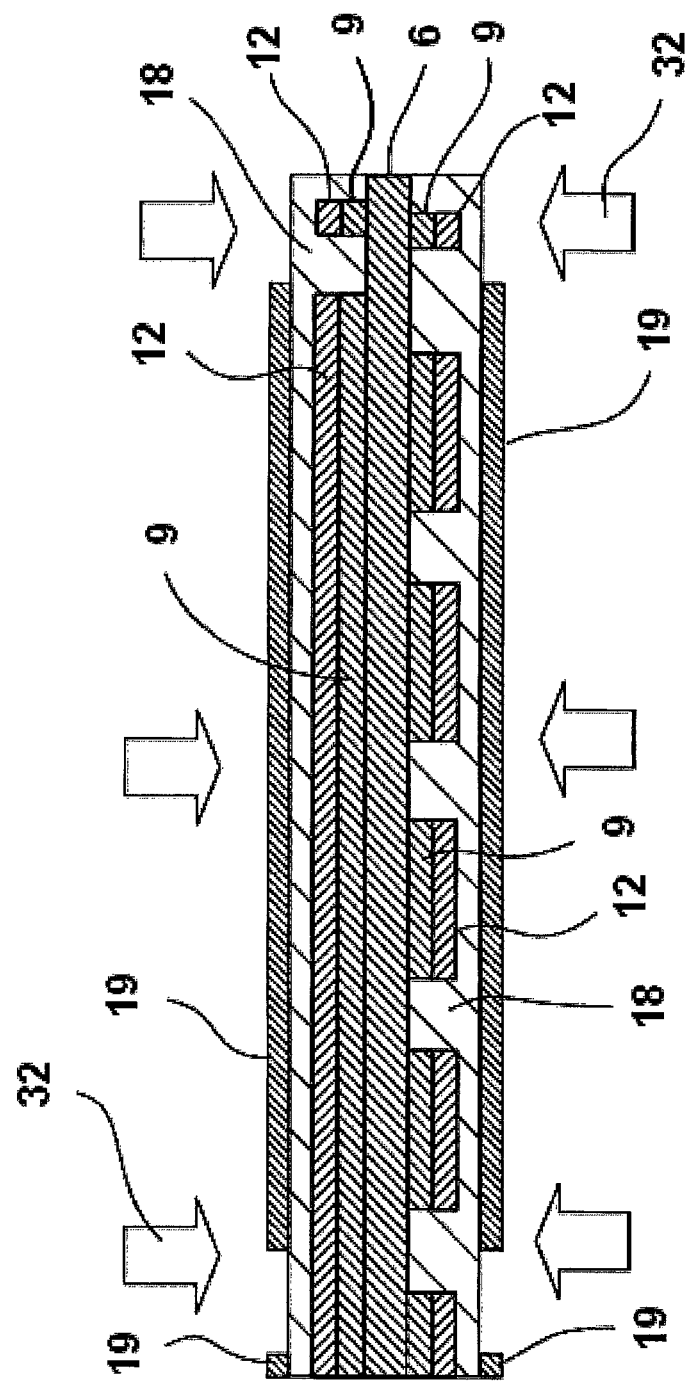
Figure 3F:
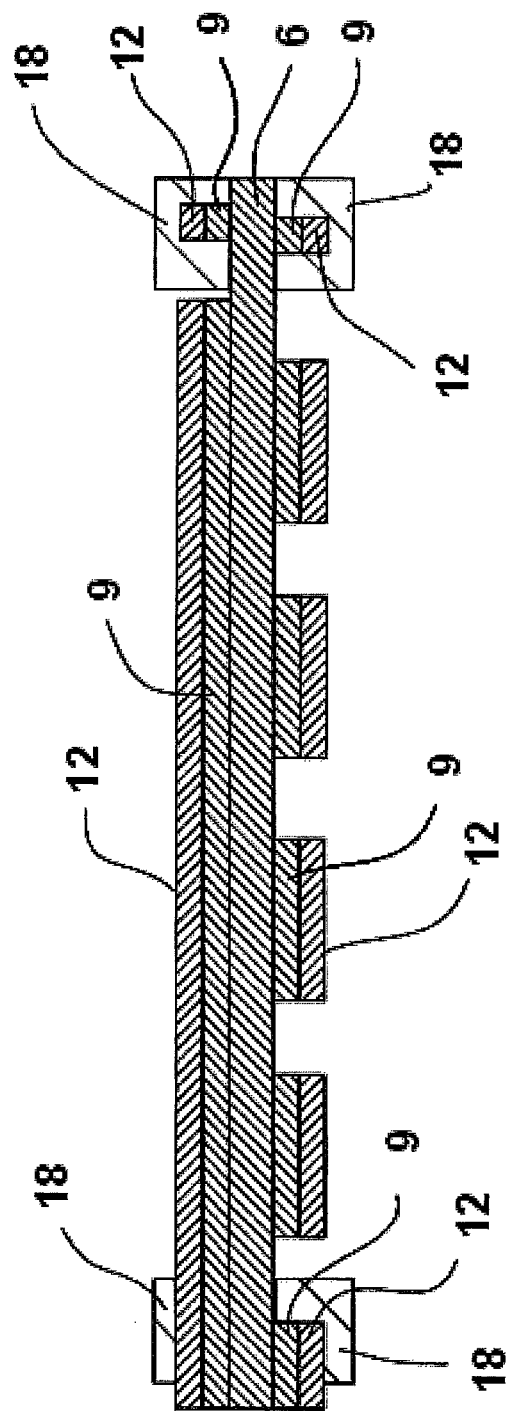
Figure 3G:
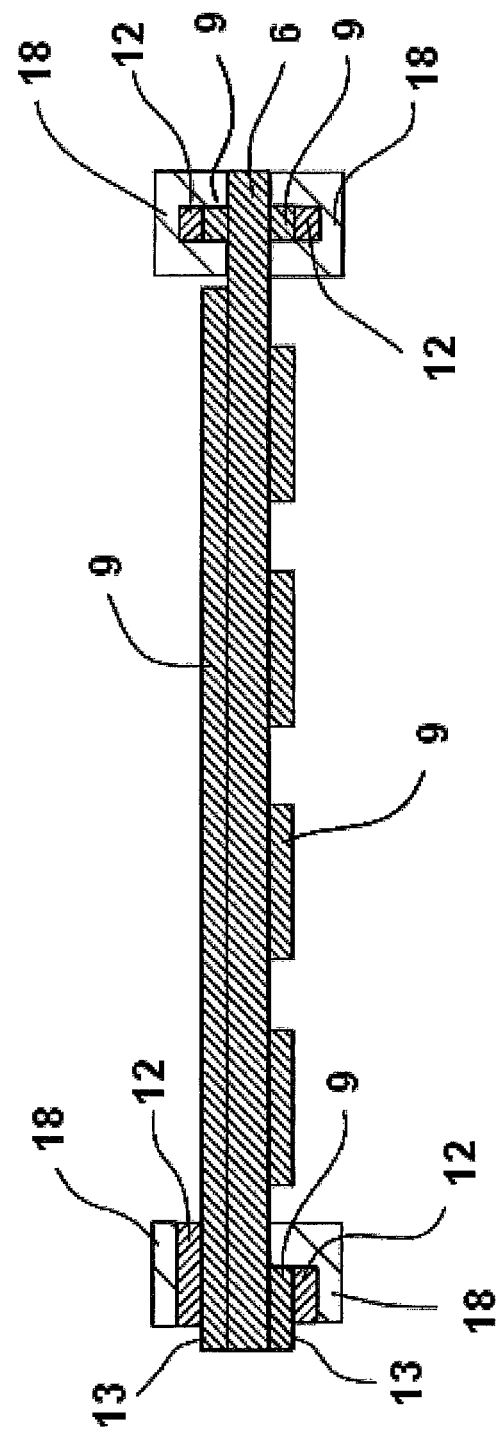
Figure 3H:
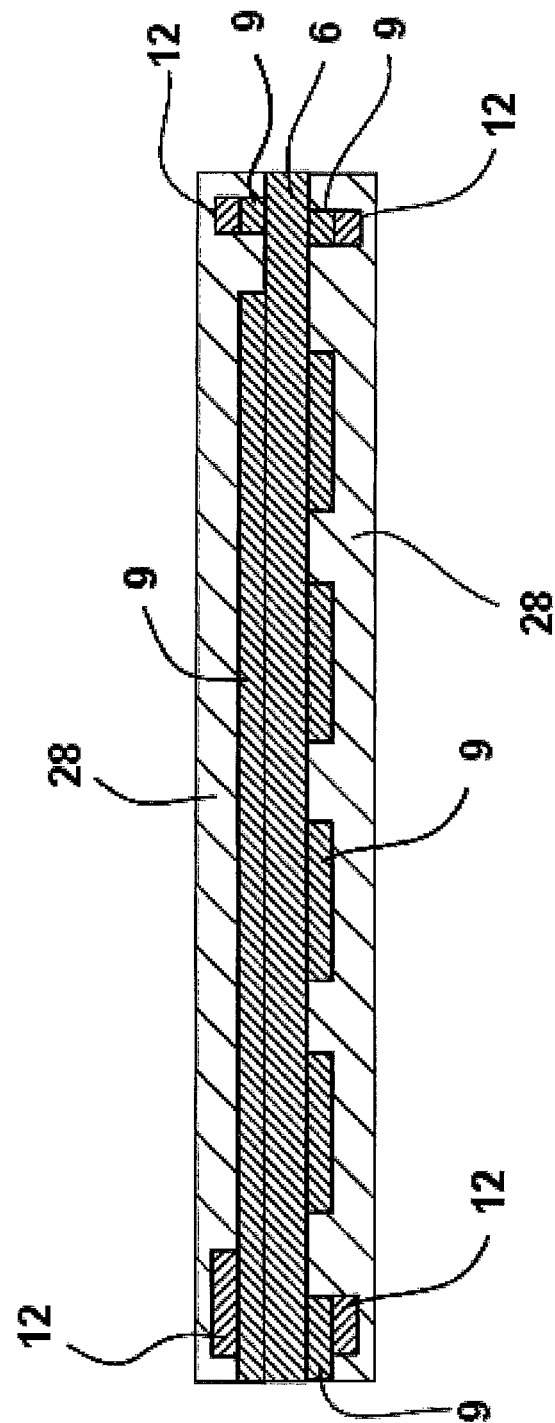
Figure 3I:
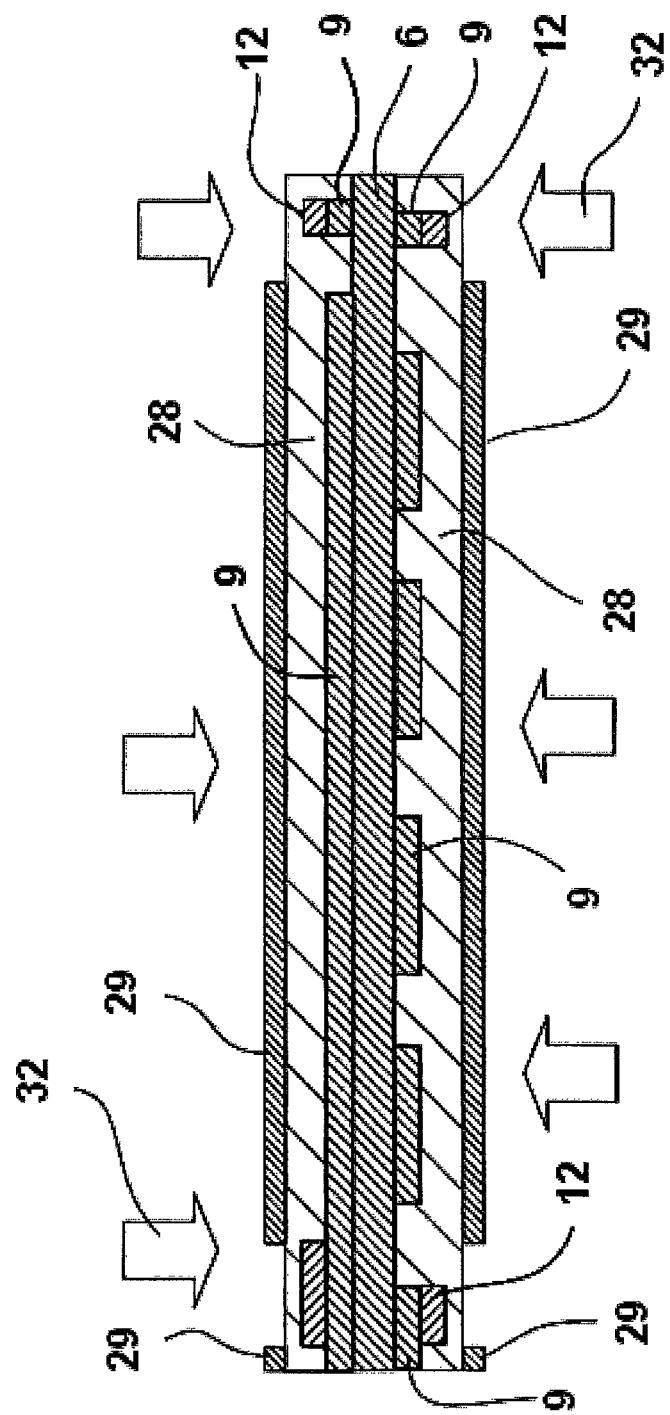
Figure 3I:
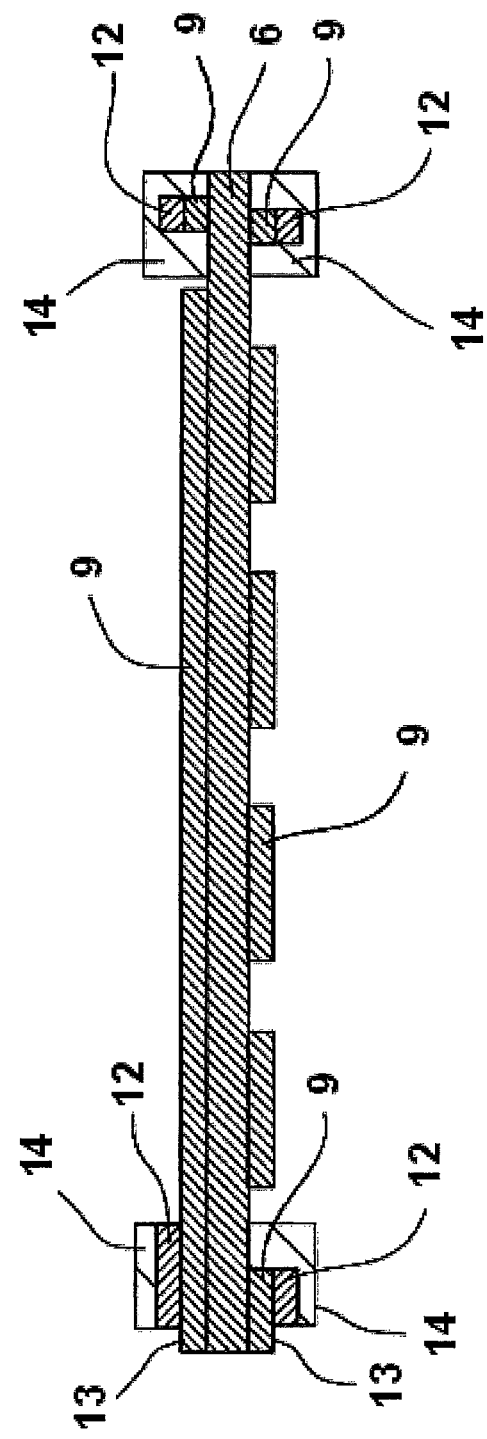
Figure 3K:
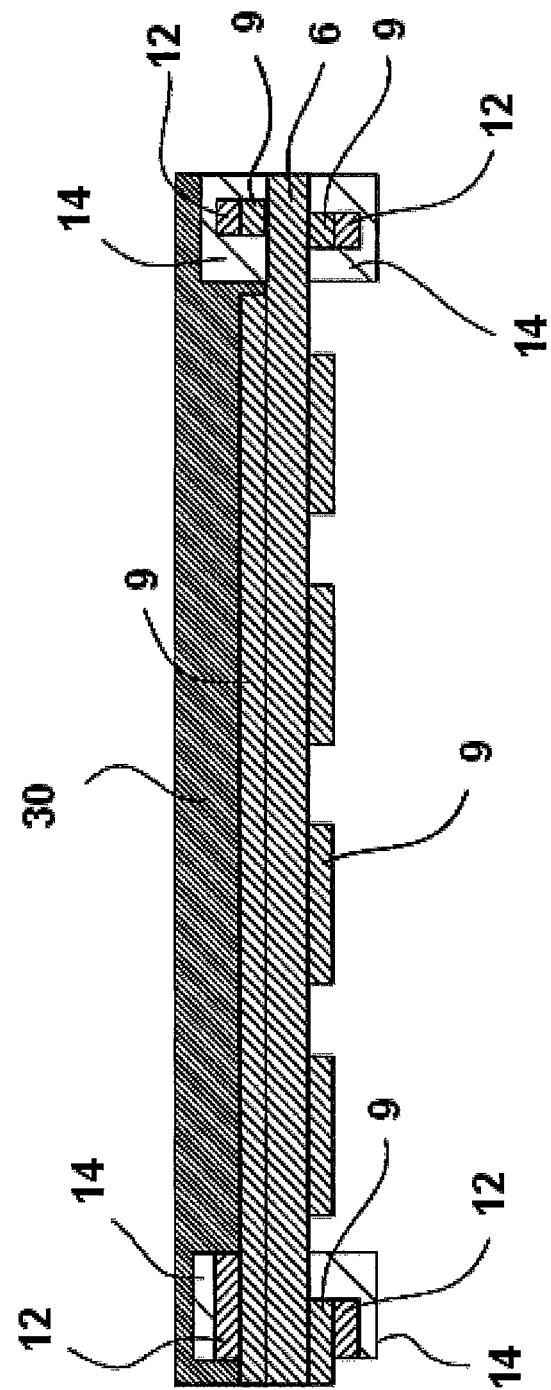
Figure 3L:
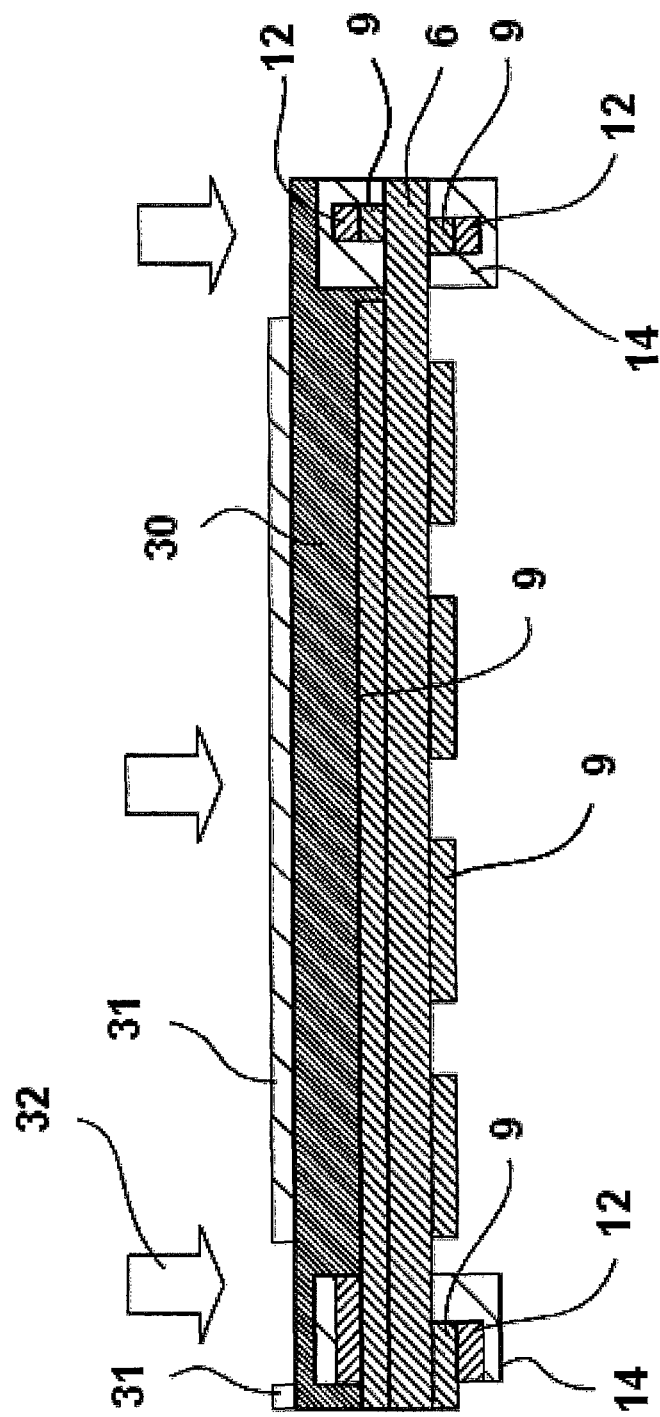
Figure 3M:
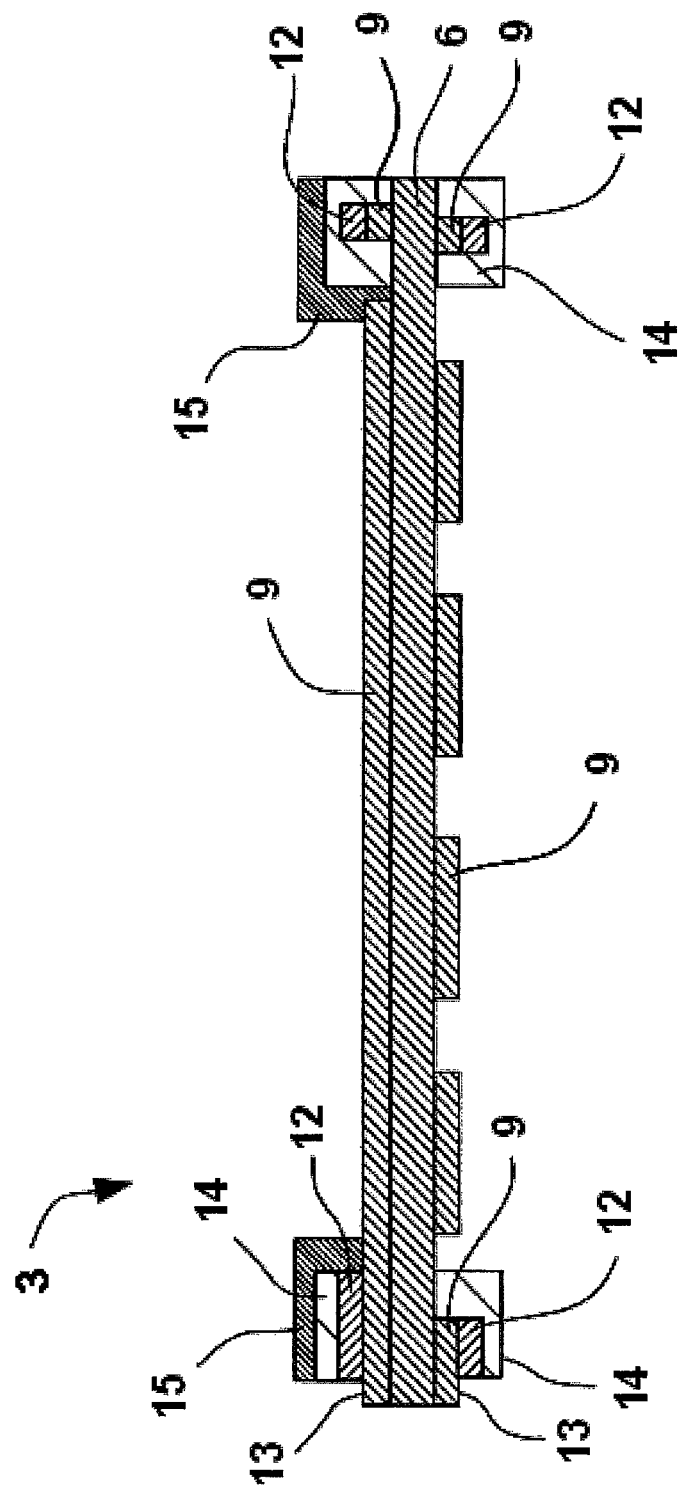

First, onto both the front and rear surfaces of the transparent base sheet 6, the transparent conductive films 9, 9, the light-blocking conductive films 12, 12, and the first photoresist layers 16, 16 are sequentially formed on the entire surface in order to obtain a conductive sheet (Refer to FIG. 3 (a)). After that, the mask 17 having a desired pattern is placed on the front surface and the rear surface, and the first photoresist layer 16 is exposed (Refer to FIG. 3 (b)) and developed for patterning. It should be noted that the position of the mask 17 shown in FIG. 3 (b) indicates that the first photoresist layer 16 is of a negative-type (when exposed, the dissolvability to the developing liquid decreases, so that the exposed portions remain after the development). In a positive-type (when exposed, the dissolvability to the developing liquid increases, so that the exposed portions are removed), portions to which the light is blocked with the mask would be opposite.

The base sheet 6 can be made of a plastic film such as polyester resin, polystyrene resin, olefin resin, polybutylene terephthalate resin, polycarbonate resin, and acrylic resin.

The transparent conductive film 9 can be made of a layer of metallic oxide such as indium tin oxide and zinc oxide, and can be made by a vacuum deposition method, a sputtering method, an ion plating method, or an electroplating method. The transparent conductive film 9 may have a thickness of approximately tens to a few hundreds nm. It is necessary that the transparent conductive film 9 can be easily etched together with the light-blocking conductive film 12 using a solution of ferric chloride or the like, but not easily etched using the etching liquid for the light-blocking conductive film 12 such as hydrogen peroxide solution in acidic atmosphere. It is preferable that the transparent conductive film 9 possess a light transmittance of 80% or higher, and a surface resistance from a few milliohms to a few hundred ohms.

As the light-blocking conductive film 12, a single metal film having high electrical conductivity and good light blocking effect may be used, or a layer made of an alloy or compound of the metal may be used. The light-blocking conductive film 12 can be formed by a vacuum deposition method, a sputtering method, an ion plating method, an electroplating method, or the like. Further, it is important that there exists an etchant that does not etch the transparent conductive film 9 but etches the light-blocking conductive film 12 itself. As a preferred example of the metal, aluminum, nickel, copper, silver, tin, and the like may be used. In particular, a metal film made of a copper foil having a thickness of 20 to 1000 nm has a good conductivity and a good light blocking effect. The transparent conductive film is very preferable in that it can be easily etched with a hydrogen peroxide solution in acidic atmosphere, which does not etch the transparent conductive film. More preferably, the thickness is 30 nm or more. Even more preferably, the thickness is from 100 to 500 nm. If the thickness is 100 nm or more, the light-blocking conductive film 12 having a high conductivity can be obtained. If the thickness is 500 nm or less, the light-blocking conductive film 12 would be easy to handle and has a good processability.

The first photoresist layer 16 may be constituted by an acrylic photoresist material having a thickness of 10 to 20 μm, which can be exposed with a high-pressure mercury vapor lamp, an ultrahigh pressure mercury lamp, a laser light, or a metal halide lamp, and developed with alkali solution. The first photoresist layer 16 can be formed on the entire surface by general-purpose printing methods such as gravure, screen, and offset, methods using various coaters, paint, and dipping, and a dry film resist method. After that, it will be exposed and developed for patterning. The dry film resist method is more preferable.

The dry film resist (DFR) used for the dry film resist method may be a film consisting of a photosensitive layer, which will be the above-described photoresist layer, sandwiched between a base film and a cover film. The above-described printing method, coating method, and paint method have problems that these methods only allow one-side coating and result in inefficiency, for example. The dry film resist method allows a high productivity and can satisfy various needs, thereby has become the mainstream, since the dry film resist method is a method of adhering the photosensitive layer with a heating roll after the cover film is stripped off. It should be noticed that the exposure is performed generally after the mask is placed above the base film (not shown) and the development is carried out after the base film is stripped off. The base film of the dry film resist can be one made of polyethylene terephthalate. Further, the cover film of the dry film resist can be one made of polyethylene.

By the way, the base sheet 6 made of plastic film has an elongation problem. Therefore, the patterning of the first photoresist layers 16 on both sides of the conductive sheet is preferably performed with simultaneous exposure to both surfaces according to the present invention. The reason will be explained as follows. If the patterning of the first photoresist layer 16 is to be performed by exposure to one side at a time, the conductive sheet needs to be turned around and attached again to the exposure apparatus after patterning is completed on one side. The base sheet 6 may be elongated in the above-described case, and the pattern on the front surface and the pattern on the rear surface may be misaligned with each other. In a case shown in FIG. 5, the location relationship between the rhombic electrodes 46 and the rhombic electrodes 47 is a complementary one, so that if the front surface pattern and the rear surface pattern are misaligned with each other, the film sensor 3 does not function correctly.

According to the present invention, when the exposure is performed, the light-blocking conductive film 12 blocks the exposing light beam 32 from the opposite side, so that simultaneous exposure with different mask patterns has no influence on the pattern of the first photoresist layer 16 on the opposite side. Accordingly, it is possible to perform the simultaneous exposure to both sides, so that alignment between the first photoresist layers 16 on both sides can be performed easily, and that both surfaces can be patterned in a single step so that productivity can be improved.

It should be noted that the alignment between the front mask and the rear mask can be performed using a known mask alignment method for a double-sided exposure apparatus. For example, an alignment mark for the mask is formed on the front mask and the rear mask, and then an optical reading sensor such as a camera reads a superposed state of the pair of the alignment marks for the masks, so that the relative positional information between the front mask and the rear mask can be obtained. Then, based on the obtained position information, a mask position adjustment mechanism moves the front mask and the rear mask relative to each other such that the centers of the mask alignment marks for the masks are overlapped with each other, thereby performing an alignment between the front mask and the rear mask.

Next, the transparent conductive films 9, 9 and the light-blocking conductive films 12, 12 are simultaneously etched using an etching liquid such as aqueous ferric chloride, so as to remove portions of the transparent conductive films 9, 9 and the light-blocking conductive films 12, 12 on which the patterned first photoresist layers 16, 16 are not laminated. As a result, the electrode pattern 10, constituted by the transparent conductive films 9, 9 and the light-blocking conductive films 12, 12 laminated without misalignment, is formed on the central windows 7 of both surfaces of the base sheet. The fine line routed circuit 11, constituted by the transparent conductive films 9, 9 and the light-blocking conductive films 12, 12 laminated without misalignment, is formed on the peripheral frames 8 of both surfaces of the base sheet (Refer to FIG. 3 (*c*)).

<Removal of Unnecessary Portions of the Light-Blocking Conductive Film 12>

Next, the first photoresist layers 16, 16 are stripped off using a photoresist stripping liquid, so as to reveal the light-blocking conductive films 12, 12. After that, on both sides, the second photoresist layers 18, 18 are formed on the entire surface (Refer to FIG. 3 (*d*)). After that, the masks 19, 19 are placed, and the second photoresist layers 18 are exposed (Refer to FIG. 3 (*e*)) and developed for patterning (Refer to FIG. 3 (*f*). It should be noted that the position of the mask 19 shown in FIG. 3 (*e*) indicates that the second photoresist layer 18 is of a negative-type (when exposed, the dissolvability to the developing liquid decreases, so that the exposed portions remain after the development). Further, the materials and forming method for the second photoresist layer 18 can be similar to those for the first photoresist layer 16.

Next, etching is performed using a special etching liquid such as acidified hydrogen peroxide. Then, only portions of the light-blocking conductive films 12, 12 on which the patterned second photoresist layers 18, 18 are not formed are removed, so that the transparent conductive films 9, 9 are revealed on the central windows 7 and on the terminals 13 in the peripheral frame 8 on both surfaces of the base sheet 6 (Refer to FIG. 3 (*g*) and FIG. 4). It should be noted that, in FIG. 4, for the fine line routed circuit pattern 11 formed on the front surface of the base sheet, the laminated portion of the light-blocking conductive film 12 is depicted in black color, and the revealed portions of the transparent conductive film 9 is depicted in white color. Two ends of the black portions correspond to a border between it and the central window 7 and a border between it and the terminals 13. As apparent from FIG. 4, since the light-blocking conductive film 12 is laminated on the fine line routed circuit pattern 11 with the same width as that of the fine line routed circuit pattern 11, it does not have the same function of the second frame-like light-blocking layer 15 according to the present invention even though it has a light blocking effect.

In addition, if the transparent conductive film 9 is made of an amorphous material, it is preferable to crystallize it with a method such as a thermal treatment before the etching. It is because crystallization improves resistance to etching, so that only the light-blocking conductive film 12 can be selectively etched more easily.

<Forming of the Anticorrosion Functional Layer 14>

Next, with a photoresist stripping liquid, the second photoresist layers 18, 18 are stripped off, so that the light-blocking conductive films 12, 12 on the fine line routed circuit pattern 11 and having the same width as that of the fine line routed circuit pattern 11 are revealed. After that, the third photoresist layers 28, 28 possessing anticorrosiveness are formed on the entire surface (Refer to FIG. 3 (*h*)). After that, the masks 29, 29 are placed, and the third photoresist layers 28, 28 are exposed (Refer to FIG. 3 (*i*)) and developed for patterning, thereby forming the anticorrosion functional layers 14, 14 (Refer to FIG. 3 (*j*)). It should be noted that the position of the mask 29 shown in FIG. 3 (*i*) indicates that the third photoresist layer 28 is of a negative-type (when exposed, the dissolvability to the developing liquid decreases, so that the exposed portions remain after the development).

The third photoresist layer 28 possessing anticorrosiveness can be made of a photoresist material similar to the first photoresist layer 16 with an additional anticorrosive agent, or one of the above-mentioned photoresist materials that possesses an anticorrosive property. Further, the method for forming the third photoresist layer 28 can be similar to that for forming the first photoresist layer 16. As the anticorrosive agent, a known material as anticorrosive agent may be used, including imidazole, triazole, benzotriazole, benzimidazole, benzthiazuron, pyrazole, for example. In addition, monocyclic or polycyclic azoles of their halogen, alkyl, phenyl substitution, aromatic amines such as aniline, aliphatic amines such as alkyl amine, and their salts may also be used. It should be noted that it is not necessary to limit materials to those specified in this embodiment.

Since the anticorrosion functional layer 14 is formed, even if a corrosive liquid invades from the outside or under a testing environment with high temperature and high humidity, the routed circuit is not corroded, thereby maintaining its electric characteristics.

<Forming of the Second Frame-Like Light-Blocking Layer 15>

Finally, the fourth photoresist layer 30 made of color resist material is formed on the entire surface only on the front surface (Refer to FIG. 3 (*k*)). After that, the masks 31, 31 are placed, and the fourth photoresist layer 30 is exposed (Refer to FIG. 3 (*l*)) and developed for patterning, thereby forming the second frame-like light-blocking layer 15 (Refer to FIG. 3 (*m*)). It should be noted that the position of the mask 31 shown in FIG. 3 (*l*) indicates that the fourth photoresist layer 30 is of a negative-type (when exposed, the dissolvability to the developing liquid decreases, and the exposed portions remain after the development).

Since the second frame-like light-blocking layer 15 is formed by photo processes shown in FIG. 3 (*k*) to FIG. 3 (*m*), linearity of the inner edge is improved. According to the present invention, since the inner edge of the second frame-like light-blocking layer 15 is positioned closer to the center than the inner edge of the first frame-like light-blocking layer 5 of the cover glass 2 formed by screen printing, the outline of the display screen to be seen through the cover glass 2 becomes sharpened. It should be noted that the difference between the dimension between the inner edges of the second frame-like light-blocking layer 15 and the dimension between the inner edges of the first frame-like light-blocking layer 5 is preferably 0.1 mm to 0.3 mm. If the difference is less than 0.1 mm, printing errors or adherence errors of the first frame-like light-blocking layer 5 may result in a side where the second frame-like light-blocking layer 15 is not revealed. If the difference exceeds 0.3 mm, it becomes difficult to achieve a narrow frame.

The color resist material used for the fourth photoresist layer 30 can be similar to the resist for RGB and black matrix constituting a color filter for the LCD display. Further, the method for forming the fourth photoresist layer 30 can be similar to that for forming the first photoresist layer 16.

Here, unlike the second frame-like light-blocking layer 15 which is manufactured by a photo process using color resist material, the reason why the first frame-like light-blocking layer 5 of the cover glass 2 is not manufactured with a photo process using color resist material will be explained. Surely, if the first frame-like light-blocking layer 5 of the cover glass 2 is manufactured with color resist material by a photo process, it may be possible to obtain linearity of the inner edge of the first frame-like light-blocking layer 5. However, when the photo process is to be performed on the cover glass 2, it is necessary for the color resist material to be coated, exposed, and developed in units of a single sheet of glass substrate 4. Even if a broad sheet of glass substrate 4 is used, it has a size limit, and the larger the size is, the heavier the weight is, thereby making it difficult for handling. In addition, it is necessary to prepare a coater, an exposure device, and a developing machine suitable for the broad glass substrate 4, which means that this is not appropriate for mass production and leads to cost increases. In contrast, if the film sensor 3 is manufactured by a photo process according to the present invention, the second frame-like light-blocking layer 15 can be obtained with a roll-to-roll at a relatively high rate.

If the color of the second frame-like light-blocking layer 15 is the same as or similar to the color of the first frame-like light-blocking layer 5 of the cover glass 2 near the inner edge, a border between the revealed portion of the frame-like second light-blocking layer 15 and the laminated portion of the first frame-like light-blocking layer 5 and the frame-like second light-blocking layer 15 is not highly visible, i.e., appears assimilated. Preferably, the color difference ΔE in L*a*b* color coordinate system of CIE (International Commission on Illumination) 1976 (JIS Z8729) between the color near the inner edge of the first frame-like light-blocking layer 5 and the color of the second frame-like light-blocking layer 15 is 10 or less.

Further, if the color of the second frame-like light-blocking layer 15 is black or white, the contrast of the display screen is also increased.

Further, a distance between the rear surface of the glass substrate 4 and the second frame-like light-blocking layer 15 is preferably between 10 μm and 100 μm. If the distance is less than 10 μm, the thickness of the transparent adhesive layer becomes too thin and the adhesion strength between the film sensor and the cover glass becomes too low. If the distance is more than 100 μm, a sense of unity in the appearance becomes deteriorated in the portions surrounding the display screen.

Further, a thickness of the first frame-like light-blocking layer 5 is preferably between 7 μm and 30 μm, and a thickness of the second frame-like light-blocking layer 15 is preferably between 2 μm and 25 μm. If the thickness is more than the upper limits in either case, the level difference between it and the non-formed portion becomes large, so that air bubbles (taint formed by the air bubbles) tend to be generated when they are adhered to each other. If the thickness is less than the lower limits in either case, it is difficult to obtain the light blocking effect with the laminated structure, and it becomes difficult to carry out film fabrication.

As described above, although one embodiment of the cover glass integrated sensor was explained, the present invention is not limited to the above-described embodiment. For example, in the first embodiment, although the second frame-like light-blocking layer 15 is formed as a layer different from the transparent conductive film 9, the light-blocking conductive film 12, and the anticorrosion functional layer 14, it is acceptable to have the second frame-like light-blocking layer 15 also serve as an anticorrosion functional layer (Hereinafter, refer to the second embodiment).

Second Embodiment

Figure 8:
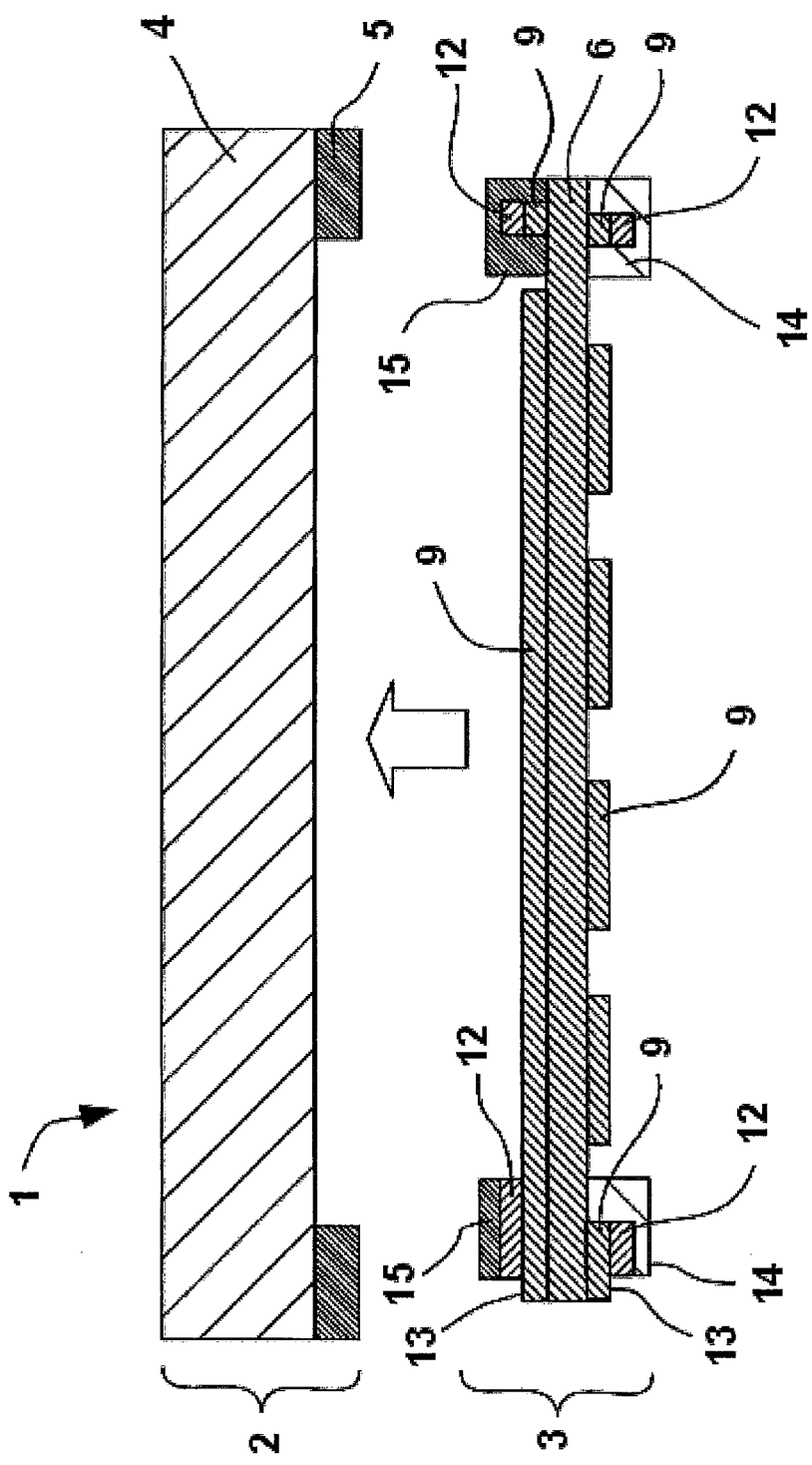
FIG. 8 is an exploded sectional view of illustrating another embodiment of the cover glass integrated sensor according to the present invention.
Figure 9A:
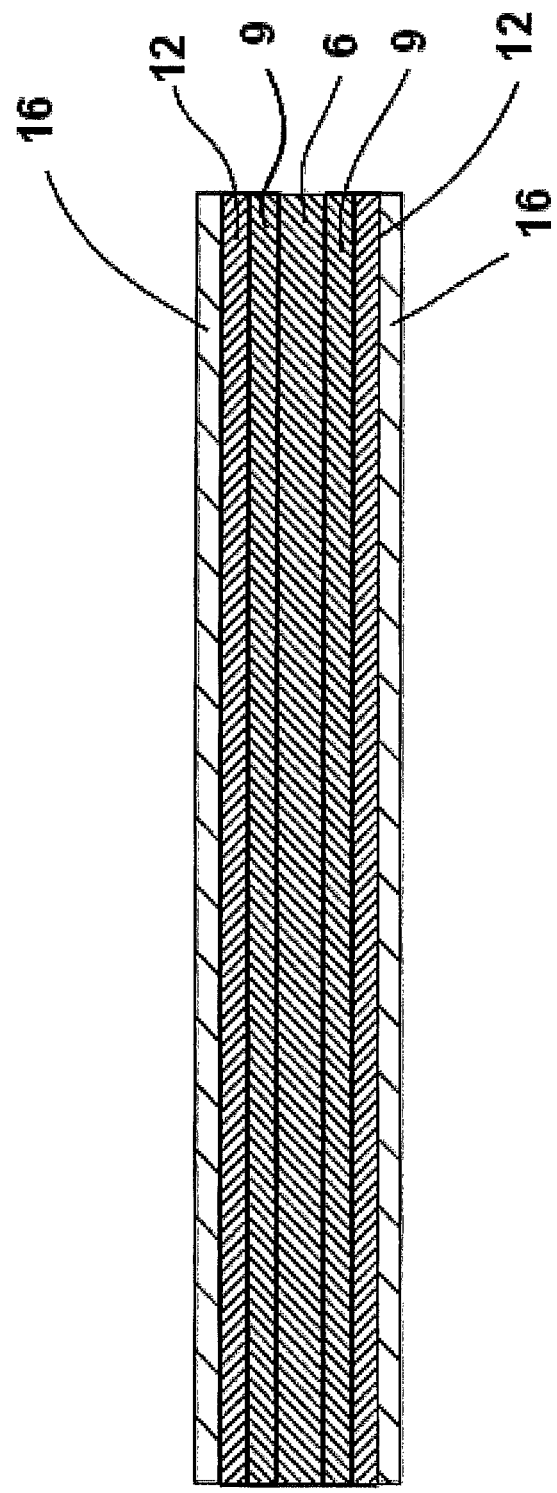
FIG. 9 (a) is a sectional view showing steps of manufacturing a film sensor shown in FIG. 8.
Figure 9B:
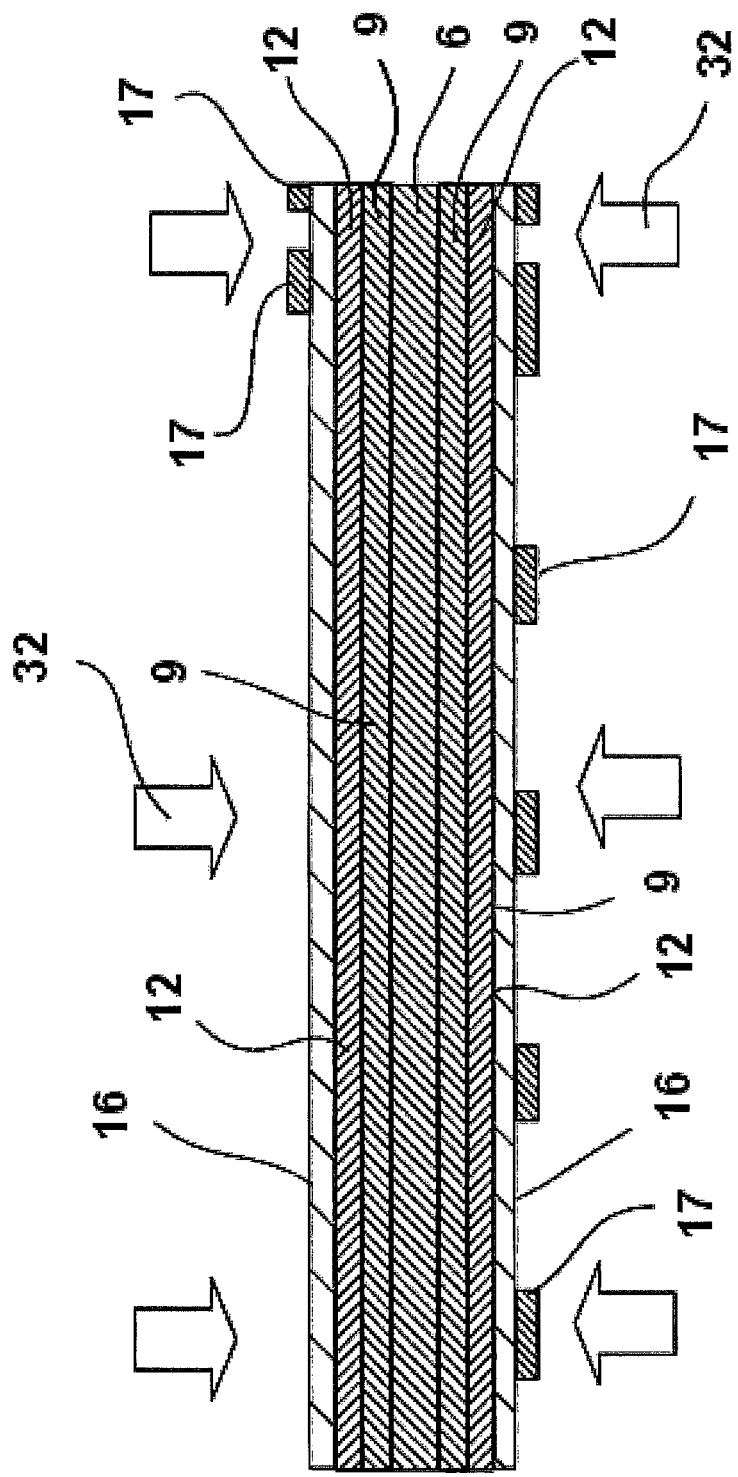
Figure 9C:
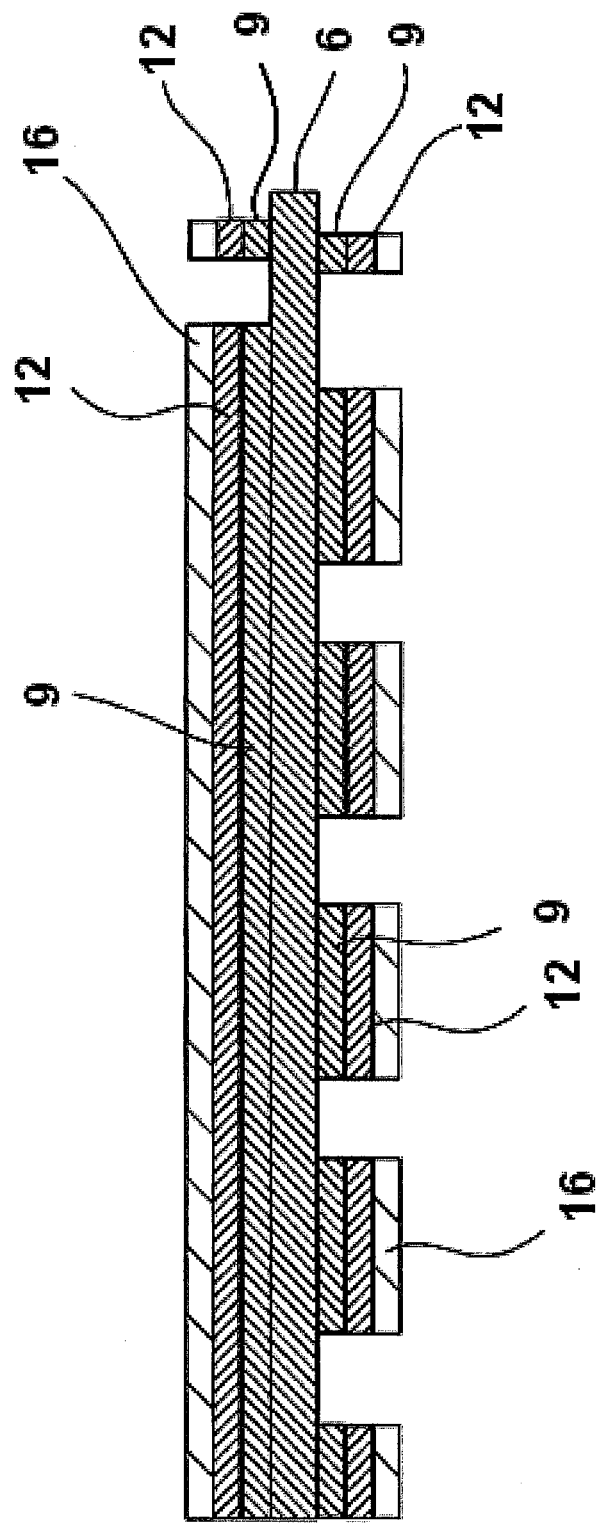
Figure 9D:
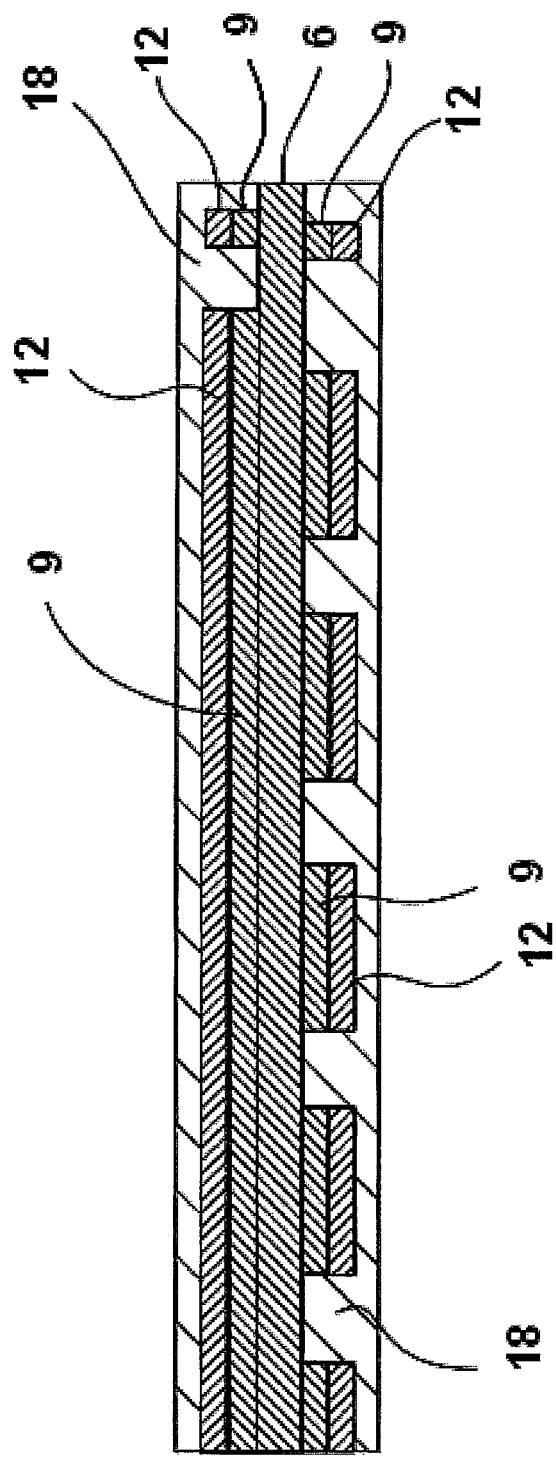
Figure 9E:
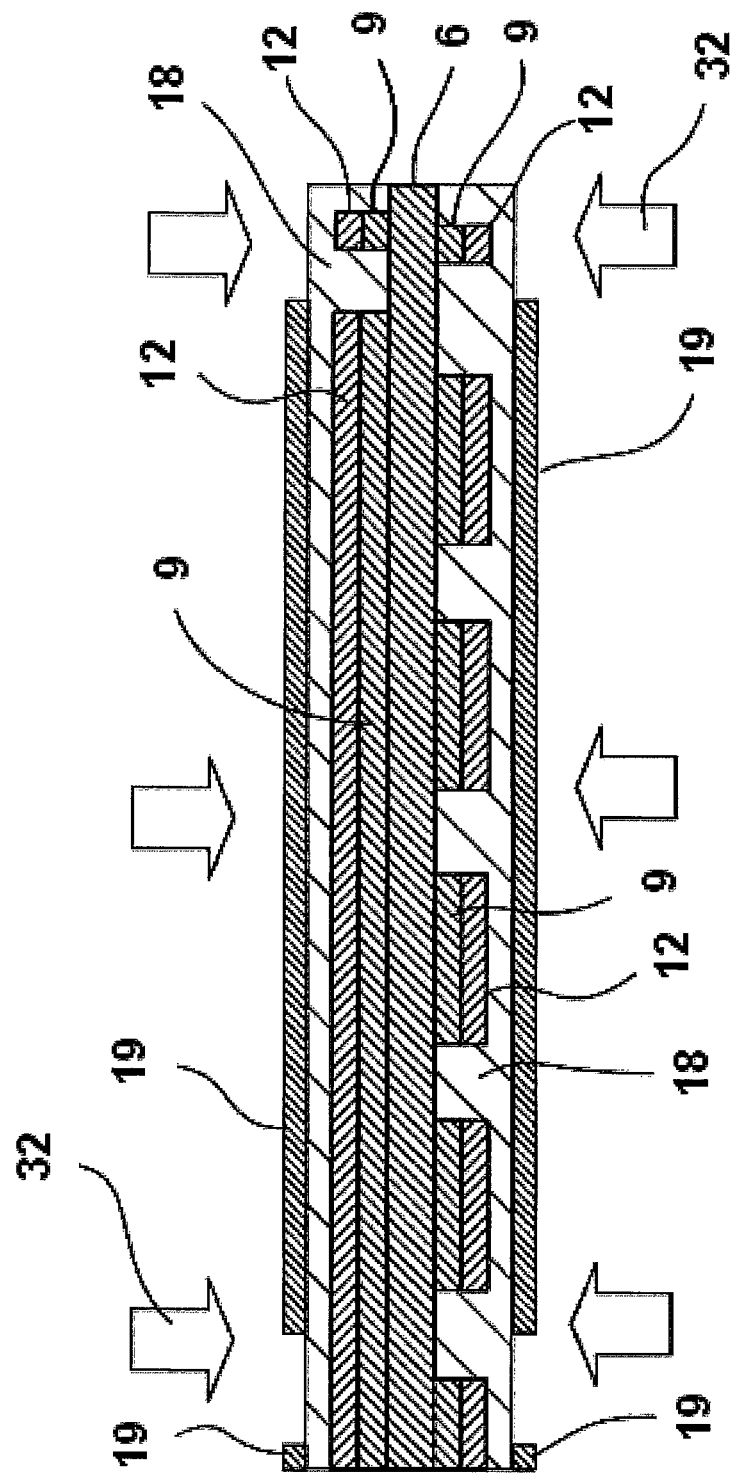
Figure 9F:
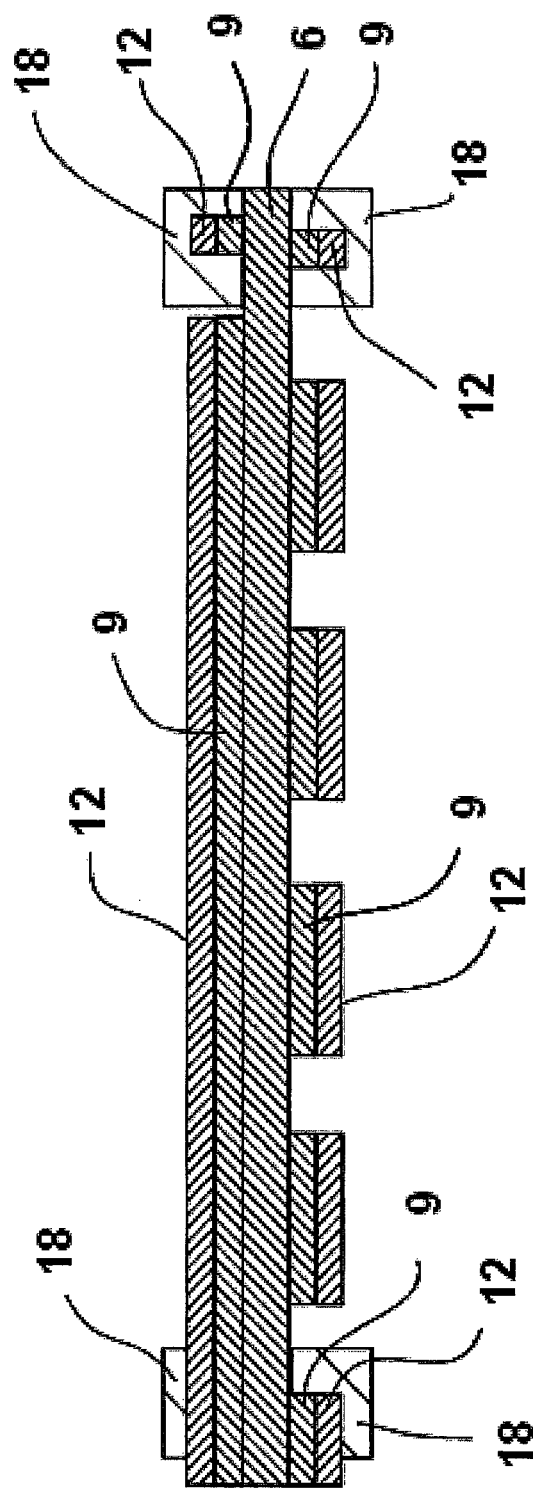
Figure 9G:
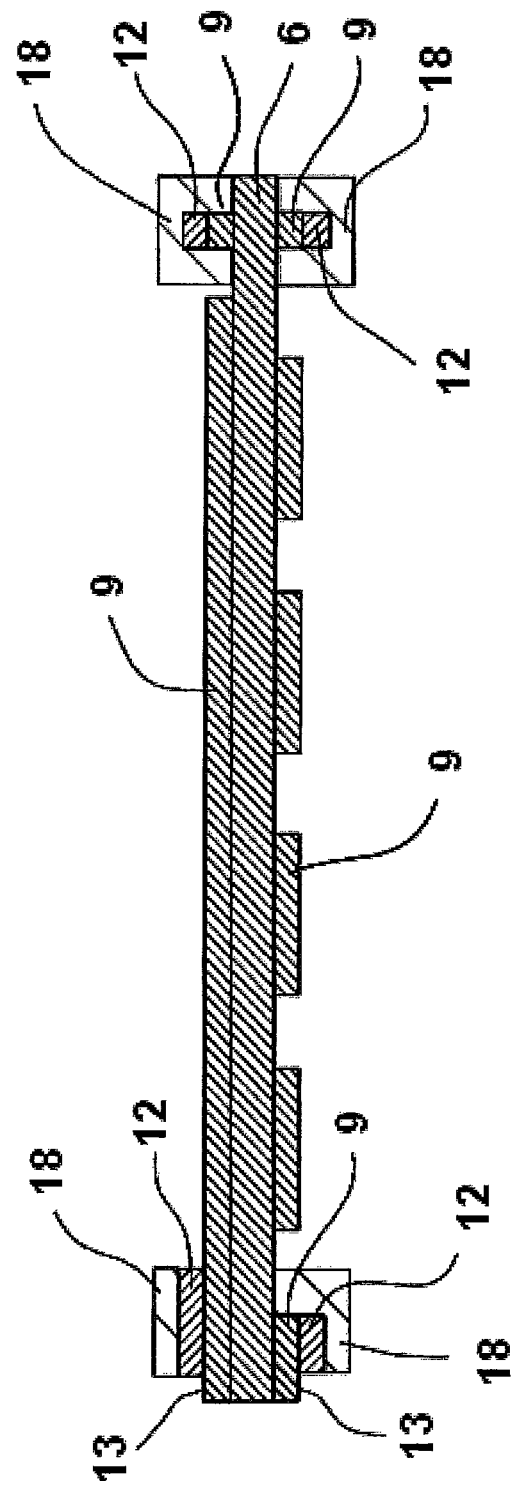
Figure 9H:
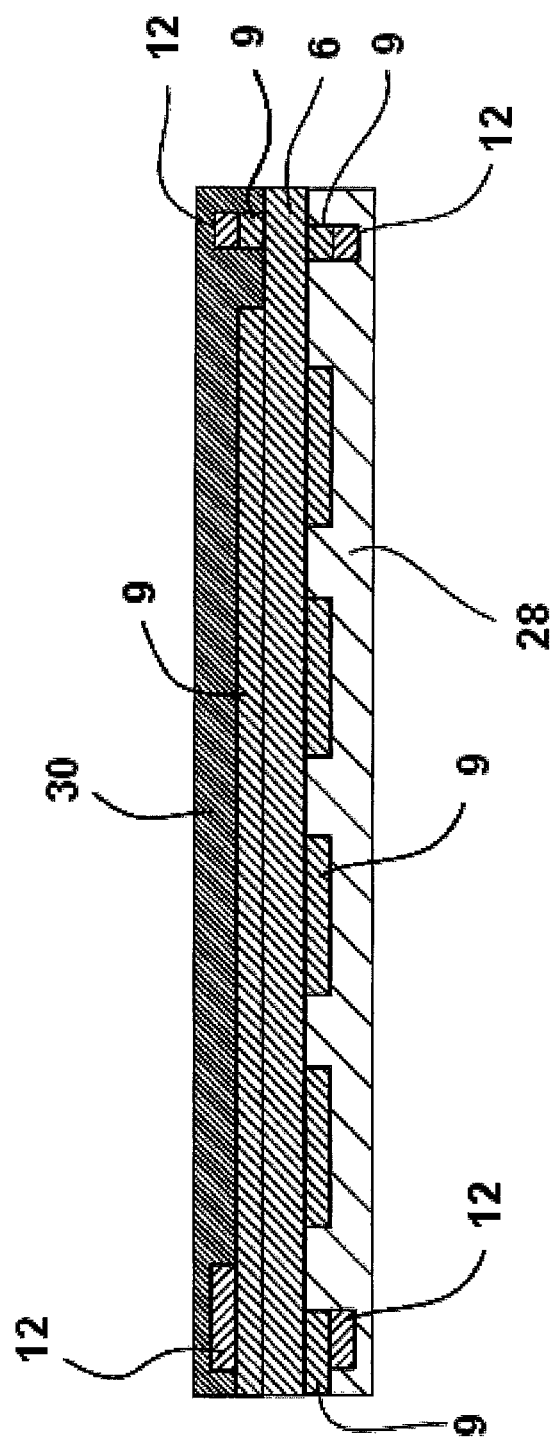
Figure 9I:
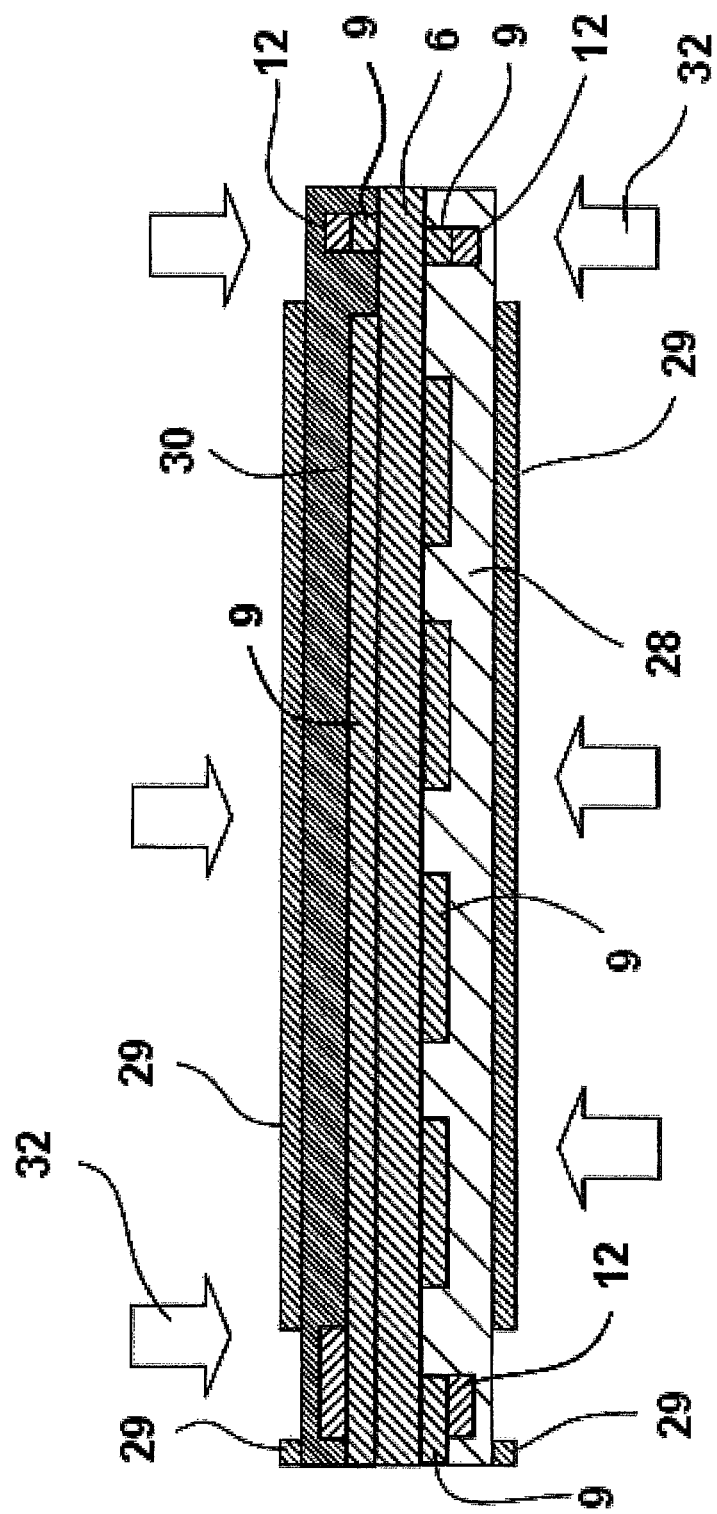
Figure 9I:
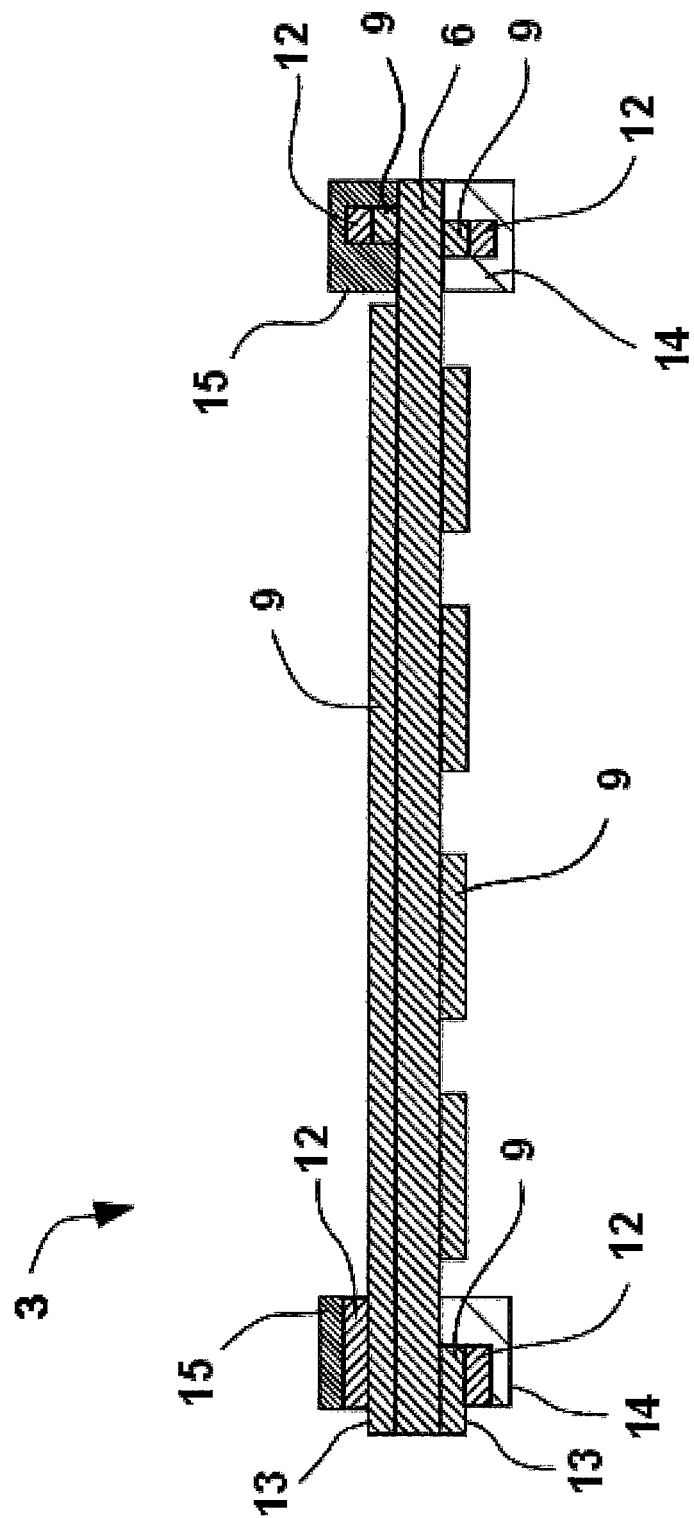

Hereinafter the second embodiment of the present invention will be described in detail with reference to figures. FIG. 8 is an exploded sectional view showing one embodiment of a cover glass integrated sensor according to the present invention. In the figure, reference numeral 1 denotes a cover glass integrated sensor, reference numeral 2 denotes a cover glass, reference numeral 3 denotes a film sensor, reference numeral 4 denotes a glass substrate, reference numeral 5 denotes a first frame-like light-blocking layer, reference numeral 6 denotes a base sheet, reference numeral 7 denotes a central window, reference numeral 8 denotes a peripheral frame, reference numeral 9 denotes transparent conductive films, reference numeral 10 denotes an electrode pattern, reference numeral 11 denotes a fine line routed circuit pattern, reference numeral 12 denotes light-blocking conductive films, reference numeral 13 denotes terminals, reference numeral 14 denotes anticorrosion functional layers, and reference numeral 15 denotes a second frame-like light-blocking layer (serving also as an anticorrosion functional layer).

The film sensor 3 of the second embodiment includes, as shown in FIG. 8, a transparent base sheet 6, transparent conductive films 9, 9, the light-blocking conductive films 12, 12, and anticorrosion functional layers 14, 15. The transparent conductive films 9, 9 are formed on both sides of the base sheet 6 such that each of them includes an electrode pattern 10 on the central window 7 and a fine line routed circuit pattern 11 on the peripheral frame 8. The light-blocking conductive films 12, 12 are formed on the fine line routed circuit pattern 11 of the transparent conductive film 9, with the same width as that of the fine line routed circuit pattern 11. The anticorrosion functional layers 14, 15 are formed on both sides of the base sheet 6 on which the transparent conductive film 9 and the light-blocking conductive film 12 have been formed so as to cover the peripheral frame 8 except the terminals 13. The anticorrosion functional layer 15 on the front surface is made of an exposure/development product of the color resist materials so as to function as a second frame-like light-blocking layer, and the inner edge of the second frame-like light-blocking layer 15 is positioned closer to the center than the inner edge of the first frame-like light-blocking layer 5. In other words, the film sensor 3 of the second embodiment is the same as the film sensor 3 of the first embodiment except that the anticorrosion functional layer also serves as the second frame-like light-blocking layer.

The method of manufacturing the film sensor 3 having the above-described structure will be described in detail hereinafter. It should be noticed that the parts of the above-described structure common to those in the first embodiment will not be explained.

<Patterning of the Transparent Conductive Films 9, 9>

First, onto the entire surface of both front and rear surfaces of the transparent base sheet 6, the transparent conductive films 9, 9, the light-blocking conductive films 12, 12, and the first photoresist layers 16, 16 are sequentially formed, so as to obtain a conductive sheet (Refer to FIG. 9 (a)). After that, masks 17, 17 having a desired pattern are put on both the front and rear surfaces, and the first photoresist layers 16, 16 are exposed (Refer to FIG. 9 (b)) and developed for patterning.

Next, with an etching liquid such as aqueous ferric chloride, the transparent conductive film 9 and the light-blocking conductive film 12 are etched simultaneously, so that portions of the transparent conductive films 9, 9 and light-blocking conductive films 12, 12 on which the patterned first photoresist layers 16, 16 have not been laminated are removed. As a result, the electrode pattern 10, constituted by the transparent conductive films 9, 9 and the light-blocking conductive films 12, 12 laminated without misalignment, is formed on the central windows of both surfaces of the base sheet. And, on the peripheral frames 8 of both surfaces of the base sheet, the fine line routed circuit 11, constituted by the transparent conductive films 9, 9 and the light-blocking conductive films 12, 12 laminated without misalignment, is formed (Refer to FIG. 9 (*c*)).

<Removal of the Unnecessary Light-blocking Conductive Films 12, 12>

Next, with the photoresist stripping liquid, the first photoresist layers 16, 16 are stripped off so as to reveal the light-blocking conductive films 12, 12. Then, the second photoresist layers 18, 18 are formed on the entire surfaces of both sides (Refer to FIG. 9 (*d*)). After that, the masks 19, 19 are placed, and the second photoresist layers 18, 18 are exposed (Refer to FIG. 9 (*e*)) and developed for patterning (Refer to FIG. 9 (*f*)).

Next, the etching is performed with a special etching liquid such as acidified hydrogen peroxide, so that only portions of the light-blocking conductive films 12, 12 on which the patterned second photoresist layers 18, 18 have not been formed are removed. Accordingly, the transparent conductive films 9, 9 are revealed on the central windows 7 and on the terminals 13 on the peripheral frames 8 of both surfaces of the base sheet (Refer to FIG. 9 (*g*) and FIG. 4).

<Forming of the Anticorrosion Functional Layer 14 and the Second Frame-Like Light-Blocking Layer 15 (Serving Also as an Anticorrosion Functional Layer)>

Next, with a photoresist stripping liquid, the second photoresist layers 18, 18 are stripped off. As a result, the light-blocking conductive films 12, 12, which have been formed on the fine line routed circuit pattern 11 and having the same width as that of the fine line routed circuit pattern 11, are revealed. After that, a third photoresist layer 28 possessing anticorrosiveness is formed on the entire surface of the rear surface, and a fourth photoresist layer 30 possessing an anticorrosive property and made of a color resist material is formed on the entire surface of the front surface, (Refer to FIG. 9 (*h*)). After that, the masks 29, 29 are placed, and the third photoresist layer 28 and the fourth photoresist layer 30 are exposed (Refer to FIG. 9 (*i*)) and developed for patterning, thereby forming the anticorrosion functional layer 14 and the second frame-like light-blocking layer 15 serving also as anticorrosion functional layer, respectively (Refer to FIG. 9 (*j*)). It should be noticed that the position of the mask 29 shown in FIG. 9 (*i*) indicates that the third photoresist layer 28 and the fourth photoresist layer 30 are of negative-type (when exposed, the dissolvability to the developing liquid decreases, so that the exposed portions remain after the development).

The third photoresist layer 28 possessing anticorrosiveness can be made of a photoresist material similar to the first photoresist layer 16 with an additional anticorrosive agent, or one of the above-mentioned photoresist materials that possesses a good anticorrosive property. In addition, the third photoresist layer 28 can be formed in the same way as that for the first photoresist layer 16. As the anticorrosive agent, a known material as anticorrosive agent may be used, including imidazole, triazole, benzotriazole, benzimidazole, benzthiazuron, pyrazole, or the like, for example. Further, monocyclic or polycyclic azoles of their halogen, alkyl, phenyl substitution, aromatic amines such as aniline, aliphatic amines such as alkyl amine, and their salts may also be used. The material is not limited to those specified in this embodiment.

The fourth photoresist layer 30, having an anticorrosive property and made of a color resist material, can be made of a color resist material, such as one that is similar to the resist for RGB and black matrix constituting a color filter for the LCD display, to which the above-mentioned anticorrosive agent is added, or can be made of a color resist material having a good anticorrosive property. The method of forming the fourth photoresist layer 30 can be similar to that for forming the first photoresist layer 16.

Since the anticorrosion functional layer 14 and the second frame-like light-blocking layer 15 serving also as the anticorrosion functional layer are formed as described, even if a corrosive liquid invades from the outside or under a testing environment with high temperature and high humidity, the routed circuit is not corroded, thereby maintaining its electric characteristics.

[Other Modifications]

The base sheet 6 is not limited to one made of a single layer plastic film as illustrated above. In other words, the base sheet 6 can be constituted by a plurality of plastic films laminated as a laminated body. In this case, as the means for laminating the plastic films, heat lamination or a dry lamination with adhesive layers can be used. If the plastic films are to be laminated with adhesive layers, as the adhesive layers, one having a core can be used in order to adjust a thickness of the whole laminated body. In addition, the timing for the plastic films to be laminated may also be any of the following: after the transparent conductive film 9 is formed on the plastic film, after the light-blocking conductive film 12 is laminated, or after the first photoresist layer 16 is laminated.

Further, when removing the unnecessary portions of the light-blocking conductive film 12, not only the portions of the light-blocking conductive film 12 where the second photoresist layer 18 has not been laminated are removed, but etching may be further performed, i.e., side etching may be performed. As a result, both ends of the laminated portion of the light-blocking conductive film 12 (black color portion in FIG. 4) may recede from their respective borders with the central window 7 and with the terminals 13. In this case, with the anticorrosive functional layers 14 laminated in the later process so as to cover the peripheral frame 8, both ends of the light-blocking conductive film 12 are protected too.

Working Example 1

As a base sheet, a colorless polyester film having a thickness of 200 μm that had been rolled out was prepared. To prepare a conductive film, on one surface of the base sheet, a transparent conductive film was formed having a thickness of 200 nm by a sputtering method using indium tin oxide, and then a light-blocking conductive film having a thickness of 500 nm was formed on the transparent conductive film by a sputtering method using a copper film. Next, a pair of these conductive films was laminated using a transparent adhesive, so that the laminated body including a set of the transparent conductive film and the light-blocking conductive film on each of the front surface and the rear surface was obtained. Then, using a dry film resist having an acrylic photosensitive layer of negative type which can be developed using sodium carbonate 1% liquid, first photoresist layers having a thickness of 10 nm was formed on the entire surfaces of both sides of the laminated body. Then, with a mask having X-direction electrode pattern on the front side, and with a mask having Y-direction electrode pattern on the rear side, both front and rear surfaces were simultaneously exposed with a metal halide lamp, and then the laminated body was dipped into the sodium carbonate 1% liquid for development.

Next, using an etching liquid such as aqueous ferric chloride, portions of indium tin oxide film and copper film where the patterned first photoresist layer had not been laminated were etched and removed simultaneously. As a result, X-direction electrode pattern was revealed and formed on the surface of the central window of the base sheet, and Y-direction electrode pattern was revealed and formed on the opposite side. On the peripheral frame surrounding the central window, a fine line routed pattern having an average line width of 20 μm was formed on both front surface and rear surface.

Next, after stripping off the first photoresist layer, a second photoresist layer having a thickness of 10 nm was formed on the entire surfaces of both sides, using a dry film resist which can be developed with sodium carbonate 1% liquid and has an acrylic photosensitive layer of negative type. Then, masks were placed on the peripheral frame except the terminals on both the front surface and the rear surface. Then, both front surface and rear surface were exposed simultaneously with a metal halide lamp, and then were dipped into the sodium carbonate 1% liquid for development.

Next, in an acidic atmosphere, by dipping into hydrogen peroxide solution, the revealed copper film on the revealed central window was etched and removed, so that only the indium tin oxide film formed under the copper film remained.

Next, after the second photoresist layer was stripped off, using a dry film resist which can be developed using sodium carbonate 1% liquid and includes an acrylic photosensitive layer of negative type to which benzimidazole as an anticorrosive agent was added, the third photoresist layer having a thickness of 10 nm was formed on the entire surface of both sides, on which a mask was placed on the peripheral frame except the terminals. Then, both front surface and rear surface were simultaneously exposed with a metal halide lamp, and then were dipped into the sodium carbonate 1% liquid for development. The third photoresist layer remained as the anticorrosion functional layer.

Next, using a dry film resist which can be developed using sodium carbonate 1% liquid and includes an acrylic photosensitive layer of negative type made of color resist material of black color, the fourth photoresist layer having a thickness of 5 μm was formed on the entire surface of only the front surface. A mask was placed on the fourth photoresist layer, and then only the front surface was exposed with a metal halide lamp. Then, it was dipped into the sodium carbonate 1% liquid for development. As a result, the fourth photoresist layer of black color remained as the second frame-like light-blocking layer. Then, a single unit of the film sensor was cut off.

On the other hand, on a backside of the peripheral portions of a glass substrate made of borosilicate glass having a thickness of 0.7 mm, screen printing with black color ink was performed so as to form a first frame-like light-blocking layer having a thickness of 7 μm, thereby obtaining a cover glass. Finally, the above-mentioned film sensor was adhered to the rear surface of the cover glass with transparent adhesive so as to make a cover glass integrated sensor. In this cover glass integrated sensor, the inner edge of the second frame-like light-blocking layer was closer toward the center than the inner edge of the first frame-like light-blocking layer by 0.1 mm, and the distance between the backside of the glass substrate and the second frame-like light-blocking layer was 25 μm. The cover glass integrated sensor had an excellent visibility, in which a sharp outline of the display screen is achieved as seen through the cover glass, and had a sense of unity in appearance at portions surrounding the display screen.

Working Example 2

As a base sheet, a colorless polyester film having a thickness of 200 μm that had been rolled out was prepared. On one surface of the base sheet, a transparent conductive film having a thickness of 200 nm was formed by sputtering using indium tin oxide. On the transparent conductive film, a light-blocking conductive film having a thickness of 500 nm was formed by sputtering using a copper film so as to prepare a conductive film. Next, a pair of these conductive films was laminated using transparent adhesive so as to obtain a laminated body including a set of the transparent conductive film and the light-blocking conductive film on each of the front surface and the rear surface. After that, using a dry film resist including an acrylic photosensitive layer of negative type which can be developed with 1% caustic soda liquid, a first photoresist layer having a thickness of 10 nm was formed on the entire surface of both sides of the laminated body. Then, after placing a mask having X-direction electrode pattern on the front surface, and placing a mask having Y-direction electrode pattern on the rear side, with a metal halide lamp, both front surface and rear surface were simultaneously exposed, and dipped into the 1% caustic soda liquid for development.

Next, using an etching liquid such as aqueous ferric chloride, portions of indium tin oxide film and copper film where the patterned first photoresist layer had not been formed were etched and removed simultaneously. As a result, the X-direction electrode pattern was formed on the surface of the central window of the base sheet, and the Y-direction electrode pattern was formed on the opposite side. On the peripheral frame surrounding the central window, a fine line routed pattern having an average line width of 20 μm was revealed and formed on both front surface and rear surface.

Next, after the first photoresist layer was stripped off, a second photoresist layer having a thickness of 10 nm was formed on the entire surface of both sides, using a dry film resist which can be developed with 1% caustic soda liquid and has an acrylic photosensitive layer of negative type. On the second photoresist layer, a mask was placed on the peripheral frame except the terminals on both the front surface and the rear surface, and both front and rear surfaces were simultaneously exposed with a metal halide lamp, and dipped into the 1% caustic soda liquid for development.

Next, in an acidic atmosphere, by dipping into hydrogen peroxide solution, the revealed copper film on the revealed central window was etched and removed. As a result, only the indium tin oxide film formed under the copper film remained.

Next, after the second photoresist layer was stripped off, a third photoresist layer having a thickness of 10 nm was formed on the entire surface of the rear surface, using a dry film resist which can be developed with 1% caustic soda liquid and has an acrylic photosensitive layer of negative type to which benzimidazole as an anticorrosive agent had been added. A fourth photoresist layer having a thickness of 5 μm was formed on the entire surface of the front surface, using a dry film resist including an acrylic photosensitive layer of negative type which can be developed with 1% caustic soda liquid and has color resist material of black color to which benzimidazole as an anticorrosive agent had been added. A mask was placed on the peripheral frames of them except the terminals. Then, both front surface and rear surface were simultaneously exposed with a metal halide lamp. Then they were dipped into the 1% caustic soda liquid for development. As a result, the third photoresist layer that remained became the anticorrosion functional layer, and the fourth photoresist layer of black color that remained became a second frame-like light-blocking layer. Finally, a single unit of the film sensor was cut off.

On the other hand, a first frame-like light-blocking layer having a thickness 7 μm was formed by screen printing using black color ink on the peripheral portions of the backside of a glass substrate made of a borosilicate glass having a thickness of 0.7 mm, thereby obtaining a cover glass. Finally, the above-mentioned film sensor was adhered to the rear surface of the cover glass with transparent adhesive, thereby making a cover glass integrated sensor. In the cover glass integrated sensor, the inner edge of the second frame-like light-blocking layer was closer to the center than the inner edge of the first frame-like light-blocking layer by 0.1 mm, and the distance between the backside of the glass substrate and the second frame-like light-blocking layer was 25 μm. The cover glass integrated sensor had an excellent visibility, in which a sharp outline of the display screen is achieved as seen through the cover glass, and had a sense of unity in appearance in portions surrounding the display screen.

The present invention relates to cover glass integrated sensors to be attached to LCD display portion of electronic devices such as portable information terminals such as PDAs and handy terminals, office automation equipment such as copying machines, facsimile apparatuses, and smartphones, portable phones, portable game devices, electronic dictionaries, car navigation systems, small PCs, digital cameras, video cameras, and portable MDs (PMD).

The invention claimed is:
1. A cover glass integrated sensor comprising:
    a cover glass of a display window for electronic devices, including a transparent glass substrate and a first frame-like light-blocking layer made of a screen printing film, the first frame-like light-blocking layer being formed on a peripheral portion of a backside of the glass substrate;
    a capacitance type film sensor adhered to a rear surface of the cover glass, the film sensor including:
        a transparent base sheet;
        transparent conductive films on both a front surface and a rear surface of the base sheet, each including an electrode pattern formed in a central window of the base sheet and a fine line routed circuit pattern formed in a peripheral frame of the base sheet;
        light-blocking conductive films formed on the fine line routed circuit patterns of the transparent conductive films, with the same width as that of the fine line routed circuit pattern;
        anticorrosion functional layers laminated on both the front surface and the rear surface of the base sheet, the base sheet having the transparent conductive films and the light-blocking conductive films formed thereon, so as to cover the peripheral frame except terminals; and
    a second frame-like light-blocking layer formed on a peripheral portion on the front surface of the base sheet, the second frame-like light-blocking layer being made of an exposed and developed product of a color resist material, and an inner edge of the second frame-like light-blocking layer being closer toward the center than an inner edge of the first frame-like light-blocking layer.

2. The cover glass integrated sensor according to claim 1, wherein
    the second frame-like light-blocking layer is formed as an additional separate layer different from the transparent conductive films, the light-blocking conductive films, and the anticorrosion functional layers.

3. The cover glass integrated sensor according to claim 2, wherein
    a distance between the backside of the glass substrate and the second frame-like light-blocking layer is 10 μm to 100 μm.

4. The cover glass integrated sensor according to claim 2, wherein
    a color of the first frame-like light-blocking layer near the inner edge and a color of the second frame-like light-blocking layer are the same or approximately the same.

5. The cover glass integrated sensor according to claim 2, wherein
    a color of the second frame-like light-blocking layer is black or white.

6. The cover glass integrated sensor according to claim 2, wherein
    a thickness of the first frame-like light-blocking layer is 7 μm to 30 μm, and a thickness of the second frame-like light-blocking layer is 2 μm to 25 μm.

7. The cover glass integral sensor according to claim 2, wherein
    a difference between a dimension between the inner edge of the second frame-like light-blocking layer and a dimension between the inner edge of the first frame-like light-blocking layer is 0.1 mm to 0.3 mm.

8. The cover glass integrated sensor according to claim 1, wherein
    the second frame-like light-blocking layer also functions as the anticorrosion functional layer.

9. The cover glass integrated sensor according to claim 8, wherein
    a distance between the backside of the glass substrate and the second frame-like light-blocking layer is 10 μm to 100 μm.

10. The cover glass integrated sensor according to claim 8, wherein
    a color of the first frame-like light-blocking layer near the inner edge and a color of the second frame-like light-blocking layer are the same or approximately the same.

11. The cover glass integrated sensor according to claim 8, wherein
    a color of the second frame-like light-blocking layer is black or white.

12. The cover glass integrated sensor according to claim 8, wherein
    a thickness of the first frame-like light-blocking layer is 7 μm to 30 μm, and a thickness of the second frame-like light-blocking layer is 2 μm to 25 μm.

13. The cover glass integral sensor according to claim 8, wherein
    a difference between a dimension between the inner edge of the second frame-like light-blocking layer and a dimension between the inner edge of the first frame-like light-blocking layer is 0.1 mm to 0.3 mm.

14. The cover glass integrated sensor according to claim 1, wherein
    a distance between the backside of the glass substrate and the second frame-like light-blocking layer is 10 μm to 100 μm.

15. The cover glass integrated sensor according to claim 14, wherein
    a color of the first frame-like light-blocking layer near the inner edge and a color of the second frame-like light-blocking layer are the same or approximately the same.

16. The cover glass integrated sensor according to claim 1, wherein
    a color of the first frame-like light-blocking layer near the inner edge and a color of the second frame-like light-blocking layer are the same or approximately the same.

17. The cover glass integrated sensor according to claim 16, wherein
   a color difference ΔE between a color of the first frame-like light-blocking layer near the inner edge and a color of the second frame-like light-blocking layer in L*a*b* color coordinate system of CIE (International Commission on Illumination) 1976 (JIS Z8729) is 10 or less.

18. The cover glass integrated sensor according to claim 1, wherein
   a color of the second frame-like light-blocking layer is black or white.

19. The cover glass integrated sensor according to claim 1, wherein
   a thickness of the first frame-like light-blocking layer is 7 μm to 30 μm, and a thickness of the second frame-like light-blocking layer is 2 μm to 25 μm.

20. The cover glass integral sensor according to claim 1, wherein
   a difference between a dimension between the inner edge of the second frame-like light-blocking layer and a dimension between the inner edge of the first frame-like light-blocking layer is 0.1 mm to 0.3 mm.

* * * * *